(12) United States Patent
Jeon et al.

(10) Patent No.: US 11,467,652 B2
(45) Date of Patent: Oct. 11, 2022

(54) SYSTEM ON CHIP AND ELECTRONIC DEVICE INCLUDING THE SAME

(71) Applicant: SAMSUNG ELECTRONICS CO., LTD., Suwon-si (KR)

(72) Inventors: Byungchul Jeon, Seongnam-si (KR); Jae Min Kim, Suwon-si (KR); Hyunseok Kim, Gwacheon-si (KR); Junho Huh, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 245 days.

(21) Appl. No.: 16/845,661

(22) Filed: Apr. 10, 2020

(65) Prior Publication Data

US 2021/0034138 A1 Feb. 4, 2021

(30) Foreign Application Priority Data

Aug. 1, 2019 (KR) .................. 10-2019-0094022

(51) Int. Cl.
| | | |
|---|---|---|
| *G06F 1/00* | (2006.01) | |
| *G06F 1/3287* | (2019.01) | |
| *G06F 1/3296* | (2019.01) | |
| *H03K 17/687* | (2006.01) | |

(52) U.S. Cl.
CPC .......... *G06F 1/3287* (2013.01); *G06F 1/3296* (2013.01); *H03K 17/6871* (2013.01)

(58) Field of Classification Search
CPC .............................. G06F 1/3287; G06F 1/3296
See application file for complete search history.

(56) References Cited

U.S. PATENT DOCUMENTS

| | | |
|---|---|---|
| 7,155,617 B2 | 12/2006 | Gary et al. |
| 7,966,511 B2 | 6/2011 | Naveh et al. |
| 8,327,158 B2 | 12/2012 | Titiano et al. |
| 8,981,829 B1 | 3/2015 | Bulzacchelli et al. |
| 9,625,924 B2 | 4/2017 | Atallah et al. |
| 9,720,490 B2 | 8/2017 | Chi et al. |
| 9,785,161 B2 * | 10/2017 | Vaisband ............... G06F 1/3243 |
| 2013/0198549 A1 * | 8/2013 | Longnecker .......... G06F 1/3237 713/324 |
| 2014/0152278 A1 | 6/2014 | Shepard et al. |
| 2014/0306673 A1 | 10/2014 | Le et al. |

(Continued)

OTHER PUBLICATIONS

Stijn Eyerman and Lieven Eeckhout, "Fine-Grained DVFS Using On-Chip Regulators", ACM Journal, Jan. 2011, pp. 1-28.

*Primary Examiner* — Mohammed H Rehman
(74) *Attorney, Agent, or Firm* — Sughrue Mion, PLLC

(57) ABSTRACT

A system on chip (SoC) includes a first core and a second core, first and second power gating switches, and a first power switch. The first power gating switch is arranged between the first core and a first power rail that receives a first voltage, and is selectively turned on in response to a first power gating signal. The second power gating switch is arranged between the second core and a second power rail that receives a second voltage, and is selectively turned on in response to a second power gating signal. The first power switch is arranged between the first power rail and the second power rail, and is selectively turned on in response to a first power control signal to connect the first power gating switch or the second power gating switch both the first power rail and the second power rail.

20 Claims, 17 Drawing Sheets

(56) References Cited

U.S. PATENT DOCUMENTS

| | | | |
|---|---|---|---|
| 2015/0268678 A1 | 9/2015 | Yu et al. | |
| 2016/0239074 A1 | 8/2016 | Lee et al. | |
| 2019/0317590 A1* | 10/2019 | Salazar | G06F 1/3287 |
| 2019/0370130 A1* | 12/2019 | Meriac | G06F 11/1687 |
| 2020/0192462 A1* | 6/2020 | Kuehnis | G01K 7/021 |
| 2022/0087045 A1* | 3/2022 | Jorge | H05K 7/1445 |

* cited by examiner

FIG. 2

| CORE1 | ACTIVE | ACTIVE | IDLE | IDLE |
|---|---|---|---|---|
| CORE2 | ACTIVE | IDLE | ACTIVE | IDLE |
| SW1 | ON | ON | OFF | OFF |
| SW2 | ON | OFF | ON | OFF |
| SW12 | OFF | ON/OFF | ON/OFF | OFF |

FIG. 11

| | | | | | | | |
|---|---|---|---|---|---|---|---|
| CORE1 | ACTIVE | ACTIVE | ACTIVE | ACTIVE | IDLE | IDLE | IDLE |
| CORE2 | ACTIVE | IDLE | ACTIVE | ACTIVE | ACTIVE | IDLE | IDLE |
| CORE3 | ACTIVE | IDLE | IDLE | ACTIVE | ACTIVE | ACTIVE | IDLE |
| CORE4 | ACTIVE | IDLE | IDLE | IDLE | ACTIVE | ACTIVE | IDLE |
| SW12 | OFF | ON/OFF | OFF | OFF | ON/OFF | OFF | OFF |
| SW23 | OFF | OFF | ON/OFF | OFF | OFF | ON/OFF | OFF |
| SW34 | OFF | OFF | OFF | ON/OFF | OFF | OFF | ON/OFF |
| SW41 | OFF | ON/OFF | ON/OFF | ON/OFF | ON/OFF | ON/OFF | OFF |

50

SYSTEM ON CHIP AND ELECTRONIC DEVICE INCLUDING THE SAME

CROSS-REFERENCE TO RELATED APPLICATION

This application claims priority from Korean Patent Application No. 10-2019-0094022, filed on Aug. 1, 2019, in the Korean Intellectual Property Office, the entire disclosure of which is incorporated by reference herein in its entirety.

BACKGROUND

1. Field

The present disclosure relates to an integrated circuit (IC), and more particularly, to a system on chip (SoC) and an electronic device including the SoC.

2. Description of the Related Art

Recently, in the computing field, performance of multimedia for which multitasking and high speed computation are required has become important, and thus, a multi-core processor, which includes a plurality of processing cores in one processor, has been developed. Meanwhile, a system on chip (SoC) indicates a technique of integrating various functional blocks, such as a central processing unit (CPU), a memory, an interface, a digital signal processing circuit, and an analog signal processing circuit, into one semiconductor integrated circuit to realize a computing system or other electronic systems, or indicates an integrated circuit (IC) generated based on this technique. As the performance of computing systems or electronic systems has increased in recent times, SoCs that include a plurality of processing cores have been developed and various methods of optimizing power management and performance of the plurality of cores included in SoCs have been studied.

SUMMARY

It is an aspect to provide a system on chip (SoC) for improving power management efficiency of a plurality of cores and an electronic device including the SoC.

According to an aspect of an embodiment, there is provided a system on chip (SoC) including a plurality of cores including at least a first core and a second core, a first power gating switch which is arranged between a first power rail transmitting a first voltage and the first core and is selectively turned on in response to a first power gating signal, a second power gating switch which is arranged between a second power rail transmitting a second voltage and the second core and is selectively turned on in response to a second power gating signal, and a first power switch which is arranged between the first power rail and the second power rail, and is selectively turned on in response to a first power control signal such that the first power gating switch or the second power gating switch is connected to both of the first and second power rails.

According to another aspect of an embodiment, there is provided an electronic device including a first voltage regulator configured to provide a first voltage to a first power rail; a second voltage regulator configured to provide a second voltage to a second power rail, a plurality of cores including at least a first core and a second core, a first power gating switch which is arranged between the first power rail and the first core and is selectively turned on in response to a first power gating signal, a second power gating switch which is arranged between the second power rail and the second core and is selectively turned on in response to a second power gating signal, and a power switch which is arranged between the first power rail and the second power rail, and is selectively turned on in response to a first power control signal such that the first power gating switch or the second power gating switch is connected to both of the first and second power rails.

According to another aspect of an embodiment, there is provided an electronic device including a first intellectual property (IP), a second IP, a first voltage regulator connected to the first IP via a first power rail and configured to provide a first voltage to the first IP, a second voltage regulator connected to the second IP via a second power rail and configured to provide a second voltage to the second IP; and a power switch which is arranged between the first and second power rails and is driven according to a power control signal, wherein, when the power control signal is enabled, the power switch is turned on to connect the first IP or the second IP to both of the first and second power rails.

BRIEF DESCRIPTION OF THE DRAWINGS

Embodiments will be more clearly understood from the following detailed description taken in conjunction with the accompanying drawings in which:

FIG. 2 is a table showing an example of operations of a first power gating switch, a second power gating switch, and a first power switch, according to operating states of a first core and a second core, according to an embodiment;

FIG. 11 is a table showing an example of operations of a first power switch, a second power switch, a third power switch, and a fourth power switch, according to operating states of a first core, a second core, a third core, and a fourth core, according to an embodiment;

DETAILED DESCRIPTION OF THE EMBODIMENTS

Hereinafter, embodiments will be described in detail with reference to the accompanying drawings.

Figure 1:
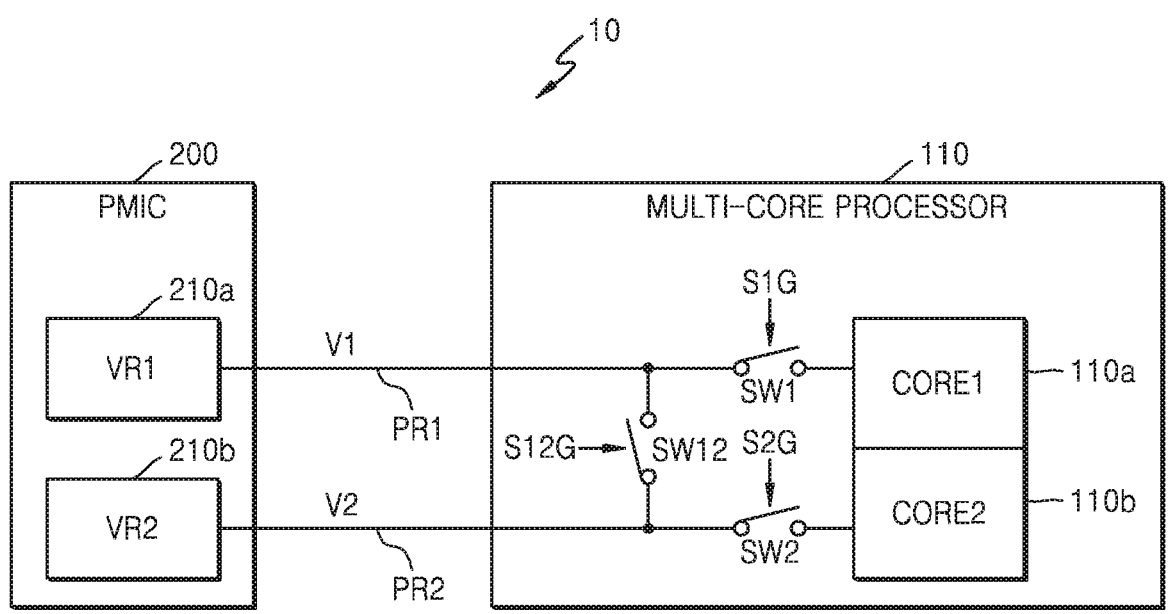
FIG. 1 is a block diagram of an electronic device according to an embodiment.

FIG. 1 is a block diagram of an electronic device according to an embodiment.

Referring to FIG. 1, an electronic device 10 may include a multi-core processor 110 and a power management integrated circuit (PMIC) 200. The multi-core processor 110 may include a first core (CORE1) 110a and a second core (CORE2) 110b and the PMIC 200 may include a first voltage regulator (VR1) 210a and a second voltage regulator (VR2) 210b. According to an embodiment, the "core" may be referred to as a processing core, a core processor, a processor or a central processing unit (CPU).

A related art PMIC which does not support per-core dynamic voltage management, may include one voltage regulator and the one voltage regulator may have to provide maximum currents required by a plurality of cores included in the multi-core processor. However, since the plurality of cores included in the multi-core processor may independently operate according to task schedules, frequently one core may not perform a task, while another core performs a task, based on characteristics of an application program. In order to reduce power consumption of a core not performing a task, separate voltages may be supplied to the plurality of cores. That is, a plurality of voltage regulators may be provided.

According to an embodiment, the PMIC 200 may support per-core dynamic voltage management by including the VR1 210a and the VR2 210b corresponding to the CORE1 110a and the CORE2 110b, respectively. Also, the electronic device 10 may support dynamic frequency management by using a phase locked loop (PLL), etc. in the multi-core processor 110. With this configuration, the electronic device 10 may realize per-core dynamic voltage frequency scaling (DVFS) via dynamic voltage management and dynamic frequency management.

In detail, the VR1 210a may generate a first voltage V1 and provide the generated first voltage V1 to the CORE1 110a via a first power rail PR1. Here, a voltage level of the first voltage V1 may be variable according to an operating frequency, an operating voltage, or a workload of the CORE1 110a. For example, when the CORE1 110a performs a high performance operation or a high speed operation, an operating frequency of the CORE1 110a may be increased, and thus, a voltage level of the first voltage V1 to be supplied to the CORE1 110a may be increased. As another example, when the CORE1 110a performs a low performance operation or a low speed operation, an operating frequency of the CORE1 110a may be decreased, and thus, a voltage level of the first voltage V1 to be supplied to the CORE1 110a may be decreased, thereby reducing power consumption of the CORE1 110a.

Similarly, the VR2 210b may generate a second voltage V2 and provide the generated second voltage V2 to the CORE2 110b via a second power rail PR2. Here, a voltage level of the second voltage V2 may be variable according to an operating frequency, an operating voltage, or a workload of the CORE2 110b. For example, when the CORE2 110b performs a high performance operation or a high speed operation, an operating frequency of the CORE2 110b may be increased, and thus, a voltage level of the second voltage V2 to be supplied to the CORE2 110b may be increased. As another example, when the CORE2 110b performs a low performance operation or a low speed operation, an operating frequency of the CORE2 110b may be decreased, and thus, a voltage level of the second voltage V2 to be supplied to the CORE2 110b may be decreased, thereby reducing power consumption of the CORE2 110b.

The multi-core processor 110 may further include a first power gating switch SW1 and a second power gating switch SW2. The first power gating switch SW1 may be arranged between the first power rail PR1 and the CORE1 110a and may be selectively turned on in response to a first power gating signal S1G. The first power rail PR1 and the CORE1 110a may be selectively connected with each other through the first power gating switch SW1. The second power gating switch SW2 may be arranged between the second power rail PR2 and the CORE2 110b and may be selectively turned on in response to a second power gating signal S2G. The second power rail PR2 and the CORE2 110b may be selectively connected with each other through the second power gating switch SW2.

The multi-core processor 110 may further include a first power switch SW12. The first power switch SW12 may be arranged between the first power rail PR1 and the second power rail PR2 and may selectively connect the first power rail PR1 with the second power rail PR2 in response to a first power control signal S12G. Through the first power switch SW12, the first or second power gating switch SW1 or SW2 may be connected to both of the first and second power rails PR1 and PR2. Hereinafter, operations of the first and second power gating switches SW1 and SW2 and the first power switch SW12 will be described with reference to FIG. 2.

FIG. 2 is a table 20 showing an example of operations of the first and second power gating switches SW1 and SW2 and the first power switch SW12 according to operating states of the CORE1 110a and the CORE2 110b of FIG. 1, according to an embodiment.

Referring to FIGS. 1 and 2 together, the operating states of the CORE1 110a may include an active state and an inactive state, and the operating states of the CORE2 110b may include an active state and an idle state. For example, there may be cases in which one of the CORE1 110a and the CORE2 110b may stop performing a task and be in a stand-by mode until the other finishes performing a task. In this situation, a core that is not processing an operation and is in the stand-by mode may be referred to as an idle core and a core performing a task may be referred to as an active core.

A power gating switch connected to an active core of the CORE1 110a and CORE2 110b may be turned on, and thus, the active core may normally receive a power supply. In detail, when the CORE1 110a is in an active state, the first power gating switch SW1 may be turned on and the first voltage V1 may be provided to the CORE1 110a from the VR1 210a. Likewise, when the CORE2 110b is in an active state, the second power gating switch SW2 may be turned on and the second voltage V2 may be provided to the CORE2 110b from the VR2 210b.

On the contrary, a power gating switch connected to an idle core of the CORE1 110a and CORE2 110b may be turned off, and thus, the idle core may be power gated to reduce power consumption of the idle core. In detail, when the CORE1 110a is in an idle state, the first power gating switch SW1 may be turned off and the first voltage V1 may not be provided to the CORE1 110a from the VR1 210a. Likewise, when the CORE2 110b is in an idle state, the second power gating switch SW2 may be turned off and the second voltage V2 may not be provided to the CORE2 110b from the VR2 210b.

When both of the CORE1 110a and the CORE2 110b are in an active state or in an idle state, the first power switch SW12 may be turned off. In other words, when both the CORE1 110a and the CORE2 110b are in a same state, the first power switch SW12 may be turned off. When only one of the CORE1 110a and the CORE2 110b is in an active state, the first power switch SW12 may be selectively turned on according to an operating voltage, an operating frequency, or a workload of the active core. For example, when only the CORE1 110a is in an active state and the operating frequency of the CORE1 110a is higher than a reference frequency, the first power switch SW12 may be turned on. Accordingly, both of the VR1 210a and the VR2 210b may be electrically connected to the CORE1 110a and a current greater than a current capacity of the VR1 210a may be provided to the CORE1 110a. As another example, when only the CORE2 110b is in an active state and the operating frequency of the CORE2 110b is higher than a reference frequency, the first power switch SW12 may be turned on. Accordingly, both of the VR1 210a and the VR2 210b may be electrically connected to the CORE2 110b and a current greater than a current capacity of the VR2 210b may be provided to the CORE2 110b.

In this configuration, for supporting per-core dynamic voltage management, one voltage regulator may be divided into the VR1 210a and the VR2 210b. A current capacity of one voltage regulator included in a related art PMIC not supporting per-core dynamic voltage management may correspond to total maximum current consumption of the CORE1 110a and the CORE2 110b, and may be, for example, 8 A. A current capacity of each of the VR1 210a and the VR2 210b included in the PMIC 200 supporting per-core dynamic voltage management may be determined based on current consumption of each of the CORE1 110a and the CORE2 110b. Here, maximum current consumption of each of the CORE1 110a and the CORE2 110b may be greater than a half of the total maximum current consumption (for example, 8 A) of the CORE1 110a and the CORE2 110b. When the multi-core processor 110 includes N cores, maximum current consumption of each core may be greater than 1/N of total maximum current consumption of the N cores (here, N is a natural number equal to or greater than 2).

When the maximum current consumption of each of the CORE1 110a and the CORE2 110b is 6 A and each of the VR1 210a and the VR2 210b is realized to have a current capacity of 6 A, total current capacity of the VR1 210a and the VR2 210b may be 12 A. Here, the total current capacity of the VR1 210a and the VR2 210b may be greater than a current capacity of a related art single voltage regulator, which is 8 A, and thus, an area of the PMIC 200 may be increased. Also, when the total current capacity is increased, the number of passive devices, such as inductors or capacitors, may be increased or a value of each passive device, such as an inductance or a capacitance, may be increased.

However, according to an embodiment, since the multi-core processor 110 includes the first power switch SW12, the current capacity of each of the VR1 210a and the VR2 210b may correspond to a half of the total maximum current consumption of the CORE1 110a and the CORE2 110b. For example, the current capacity of each of the VR1 210a and the VR2 210b may be 4 A. Accordingly, the total current capacity of the VR1 210a and the VR2 210b may be 8 A, which is the same as the current capacity of the previous single voltage regulator. Thus, while the per-core dynamic voltage management is supported, the area of the PMIC 200 may not be increased. Also, the number of passive devices, such as inductors and capacitors, may not be increased, or a value of each passive device, that is, an inductance or a capacitance, may not be increased.

Figure 3:
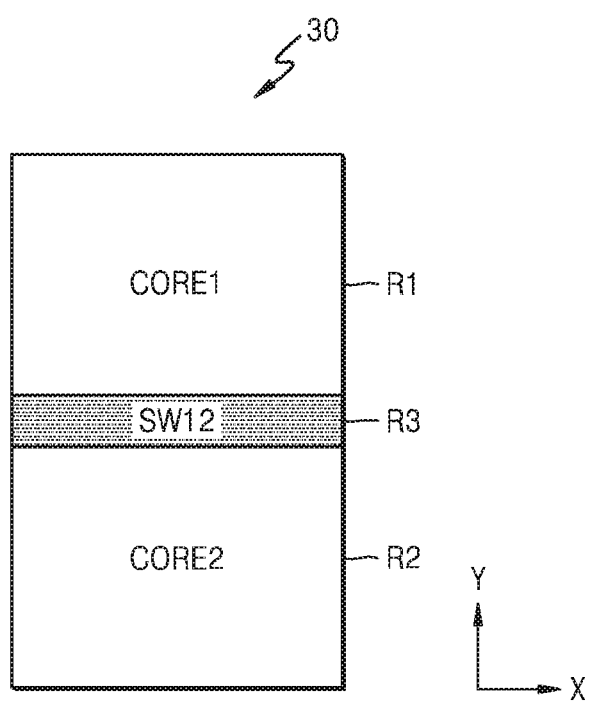
FIG. 3 is a layout of a multi-core processor including a first core and a second core, according to an embodiment.

FIG. 3 is a layout 30 of a multi-core processor including a CORE1 and a CORE2, according to an embodiment.

Referring to FIG. 3, the layout 30 of the multi-core processor may correspond to, for example, a layout of the multi-core processor 110 of FIG. 1. The layout 30 of the multi-core processor may include a first region R1, a second region R2, and a third region R3 adjacent to one another in a Y direction. The CORE1 may be arranged in the first region R1 and the CORE2 may be arranged in the second region R2. Each of the first and second regions R1 and R2 may have a certain area extending in an X direction and the Y direction. The areas may be the same size or different sizes. A first power switch SW12 may be arranged in the third region R3 between the first and second regions R1 and R2.

Figure 4:
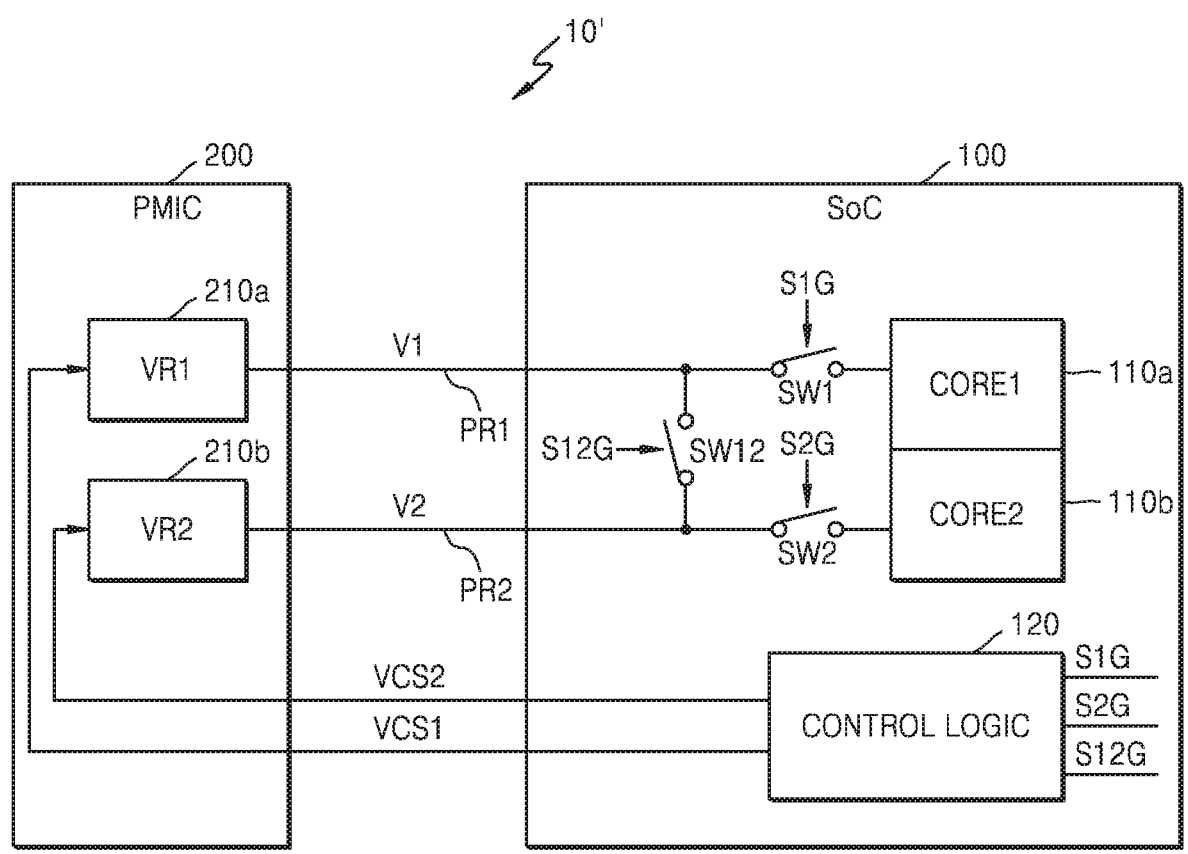
FIG. 4 is a block diagram of an electronic device according to an embodiment.

FIG. 4 is a block diagram of an electronic device according to an embodiment.

Referring to FIG. 4, an electronic device 10' may include a system on chip (SoC) 100 and the PMIC 200. The SoC 100 may include the CORE1 110a and the CORE2 110b, the first and second power gating switches SW1 and SW2, the first power switch SW12, and a control logic 120. FIG. 4 illustrates that the PMIC 200 is realized outside the SoC 100. However, embodiments are not limited thereto and in some embodiments, the PMIC 200 may be included in/on the SoC 100. The PMIC 200 may correspond to the PMIC 200 of FIG. 1 and the electronic device 10' may be a modified example of the electronic device 10 of FIG. 1. The aspects described in detail with reference to FIGS. 1 through 3 may be applied to the embodiment shown in FIG. 4, and repeated descriptions of like element will not be given for conciseness.

The control logic 120 may determine operating states of the CORE1 110a and the CORE2 110b and generate the first and second power gating signals S1G and S2G based on the determined operating states. Also, the control logic 120 may monitor operating frequencies of the CORE1 110a and the CORE2 110b. The control logic 120 may generate the first power control signal S12G based on the operating states and the operating frequencies of the CORE1 110a and the CORE2 110b.

The control logic 120 may generate a first voltage control signal VCS1 and a second voltage control signal VCS2 based on the operating states and the operating frequencies of the CORE1 110a and the CORE2 110b. The control logic 120 may provide the generated first and second voltage control signals VCS1 and VCS2 to the VR1 210a and the VR2 210b, respectively. The VR1 210a may regulate a voltage level of the first voltage V1 based on the first voltage control signal VCS1. The VR2 210b may regulate a voltage level of the second voltage V2 based on the second voltage control signal VCS2.

According to some embodiments, when the first power control signal S12G is enabled, that is, when the first power switch SW12 is turned on, the control logic 120 may generate the first and second voltage control signals VCS1 and VCS2 such that the voltage levels of the first and second voltages V1 and V2 are the same as each other. Accordingly, the VR1 210a and the VR2 210b may generate the first and second voltages V1 and V2, respectively, the first and second voltages V1 and V2 having the same voltage level.

According to an embodiment, the SoC 100 may be realized as one chip including the CORE1 110a and the CORE2 110b, the first and second power gating switches SW1 and SW2, the first power switch SW12, and the control logic 120. However, embodiments are not limited thereto. According to some embodiments, the CORE1 110a and the CORE2 110b, the first and second power gating switches SW1 and SW2, and the first power switch SW12 may be realized on a first chip and the control logic 120 may be realized on a second chip. The PMIC 200 including the VR1 210a and the VR2 210b may be realized on a separate chip from the SoC 100. According to an embodiment, each of the PMIC 200 and the SoC 100 may be realized on a separate chip and may be included in one package, such as a system in package (SIP).

Figure 5:
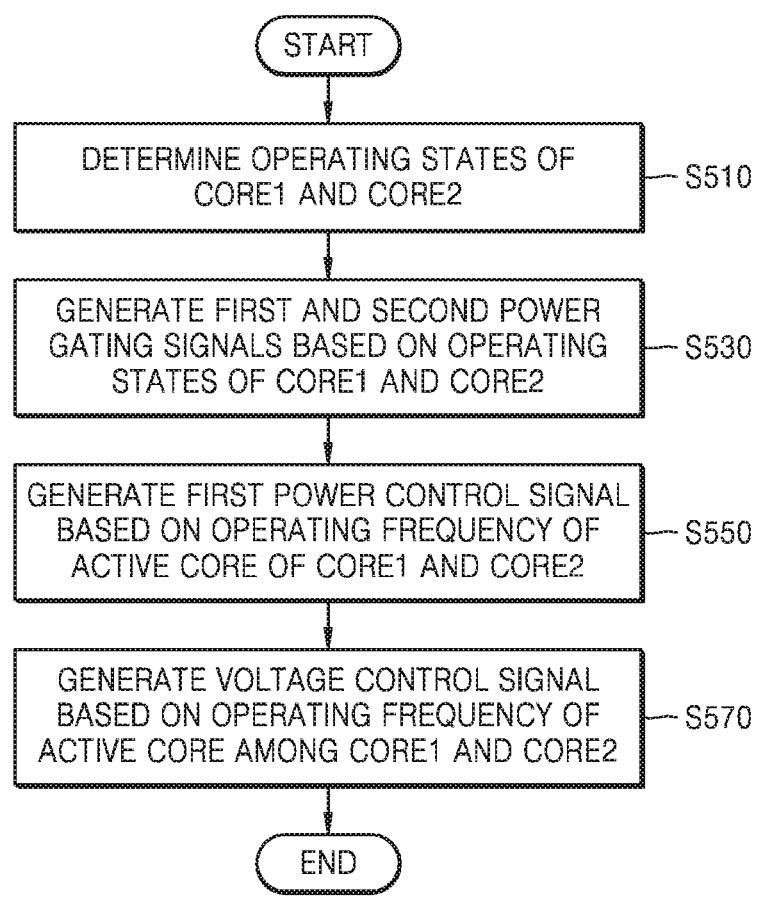
FIG. 5 is a flowchart of an operating method of a system on chip (SoC), according to an embodiment.

FIG. 5 is a flowchart of an operating method of an SoC, according to an embodiment.

Referring to FIG. 5, the operating method of the SoC according to an embodiment may be an operating method of a multi-core processor for per-core dynamic voltage management, and may include, for example, sequential operations performed on the SoC 100 of FIG. 4. Hereinafter, the operating method of the SoC will be described with reference to FIGS. 4 and 5 together.

In operation S510, the control logic 120 may determine operating states of the CORE1 110a and the CORE2 110b. For example, the control logic 120 may include a scheduler logic configured to schedule tasks of the CORE1 110a and the CORE2 110b and may determine the operating states of the CORE1 110a and the CORE2 110b based on the scheduled tasks of the CORE1 110a and the CORE2 110b. However, embodiments are not limited thereto. The control logic 120 may receive task schedules of the CORE1 110a and the CORE2 110b from outside the SoC and may determine the operating states of the CORE1 110a and the CORE2 110b based on the received task schedules. For example, in some embodiments, the control logic 120 may receive task schedules of the CORE1 110a and the CORE2 110b from an external scheduler logic.

In operation S530, the control logic 120 may generate the first and second power gating signals S1G and S2G according to the operating states of the CORE1 110a and the CORE2 110b. For example, the control logic 120 may generate the first and second power gating signals S1G and S2G to drive the first and second power gating switches SW1 and SW2 as shown in the table 20 of FIG. 2, according to the operating states of the CORE1 110a and the CORE2 110b.

In operation S550, the control logic 120 may generate the first power control signal S12G based on an operating frequency of an active core of the CORE1 110a and the CORE2 110b. However, embodiments are not limited thereto. The control logic 120 may generate the first power control signal S12G based on an operating voltage or a workload of the active core. Here, the control logic 120 may disable the first power control signal S12G when both of the CORE1 110a and the CORE2 110b are in an active state or an idle state, as illustrated in FIG. 2.

In operation S570, the control logic 120 may generate a voltage control signal based on the operating frequency of the active core of the CORE1 110a and the CORE2 110b. However, embodiments are not limited thereto. The control logic 120 may generate the voltage control signal based on the operating voltage or the workload of the active core. For example, in some embodiments, the voltage control signal may include the first and second voltage control signals VCS1 and VCS2. According to an embodiment, operation S550 and operation S570 may be substantially simultaneously performed. According to another embodiment, the order of operation S550 and operation S570 may be changed, that is operation S570 may be performed before operation S550.

Figure 6:
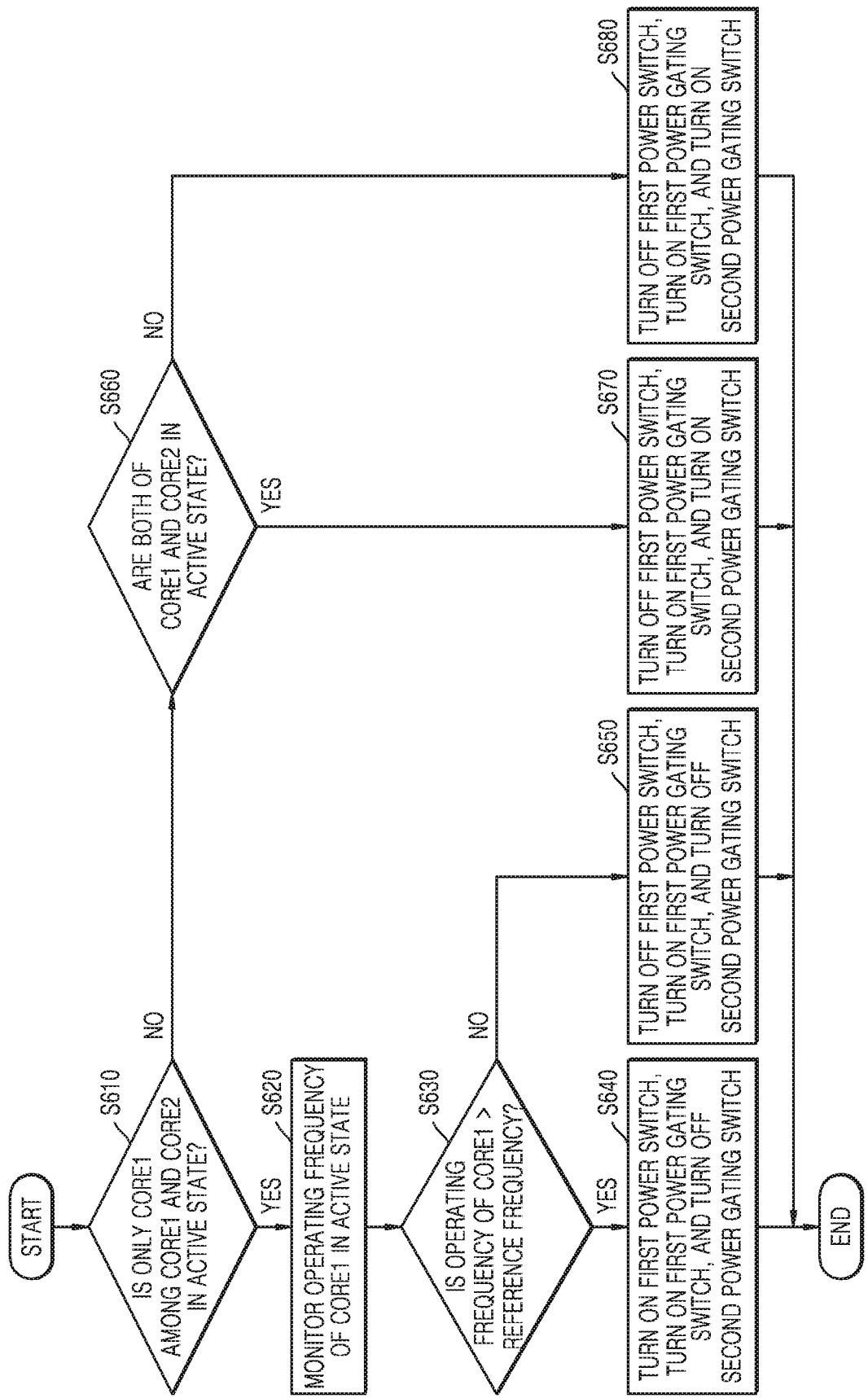
FIG. 6 is a detailed flowchart of an operating method of an SoC, according to an embodiment.

FIG. 6 is a detailed flowchart of an operating method of an SoC, according to an embodiment.

Referring to FIG. 6, the operating method of the SoC according to an embodiment may be an operating method for regulating a voltage level provided to each of a plurality of cores included in a multi-core processor, and may include, for example, sequential operations performed on the SoC 100 of FIG. 4. According to an embodiment, an operation of a first power switch may be controlled based on an operating frequency of an active core. However, it is only an example embodiment and embodiments are not limited thereto. Hereinafter, the operating method of the SoC will be described with reference to FIGS. 4 and 6 together.

In operation S610, the control logic 120 may determine whether only the CORE1 110a of the CORE1 110a and the CORE2 110b is in an active state. Based on a result of the determining, when only the CORE1 110a is in an active state (operation S610, YES), operation S620 may be performed, and when the CORE1 110a is not in the active state (operation S610, NO), operation S660 may be performed. In operation S620, the control logic 120 may monitor an operating frequency of the CORE1 110a which is in the active state.

In operation S630, the control logic 120 may determine whether the operating frequency of the CORE1 110a is higher than a reference frequency. For example, when the CORE1 110a performs a high performance operation or a high speed operation, the operating frequency of the CORE1 110a may be higher than the reference frequency. Here, the reference frequency may be defined as a frequency at which the CORE1 110a requires a current greater than a current capacity of the VR1 210a corresponding to the CORE1 110a. On the other hand, when the operating frequency of the CORE1 110a is equal to or less than the reference frequency, the current required for an operation of the CORE1 110a may be equal to or less than the current capacity of the VR1 210a.

Based on a result of the determining, when the operating frequency of the CORE1 110a is higher than the reference frequency (operation S630, YES), in operation S640, the control logic 120 may turn on the first power switch SW12, turn on the first power gating switch SW1, and turn off the second power gating switch SW2. On the other hand, based on a result of the determining, when the operating frequency of the CORE1 110a is less than or equal to the reference frequency (operation S630, NO), in operation S650, the control logic 120 may turn off the first power switch SW12, turn on the first power gating switch SW1, and turn off the second power gating switch SW2.

In operation S660, the control logic 120 may determine whether both of the CORE1 110a and the CORE2 110b are in an active state. Based on a result of the determining, when both of the CORE1 110a and the CORE2 110b are in the active state (operation S660, YES), in operation S670, the control logic 120 may turn off the first power switch SW12 and turn on the first and second power gating switches SW1 and SW2. Based on a result of the determining, when both of the CORE1 110a and the CORE2 110b are not in the active state (operation S660, NO), in operation S680, the control logic 120 may turn off the first power switch SW12 and turn off the first and second power gating switches SW1 and SW2.

Figure 7:
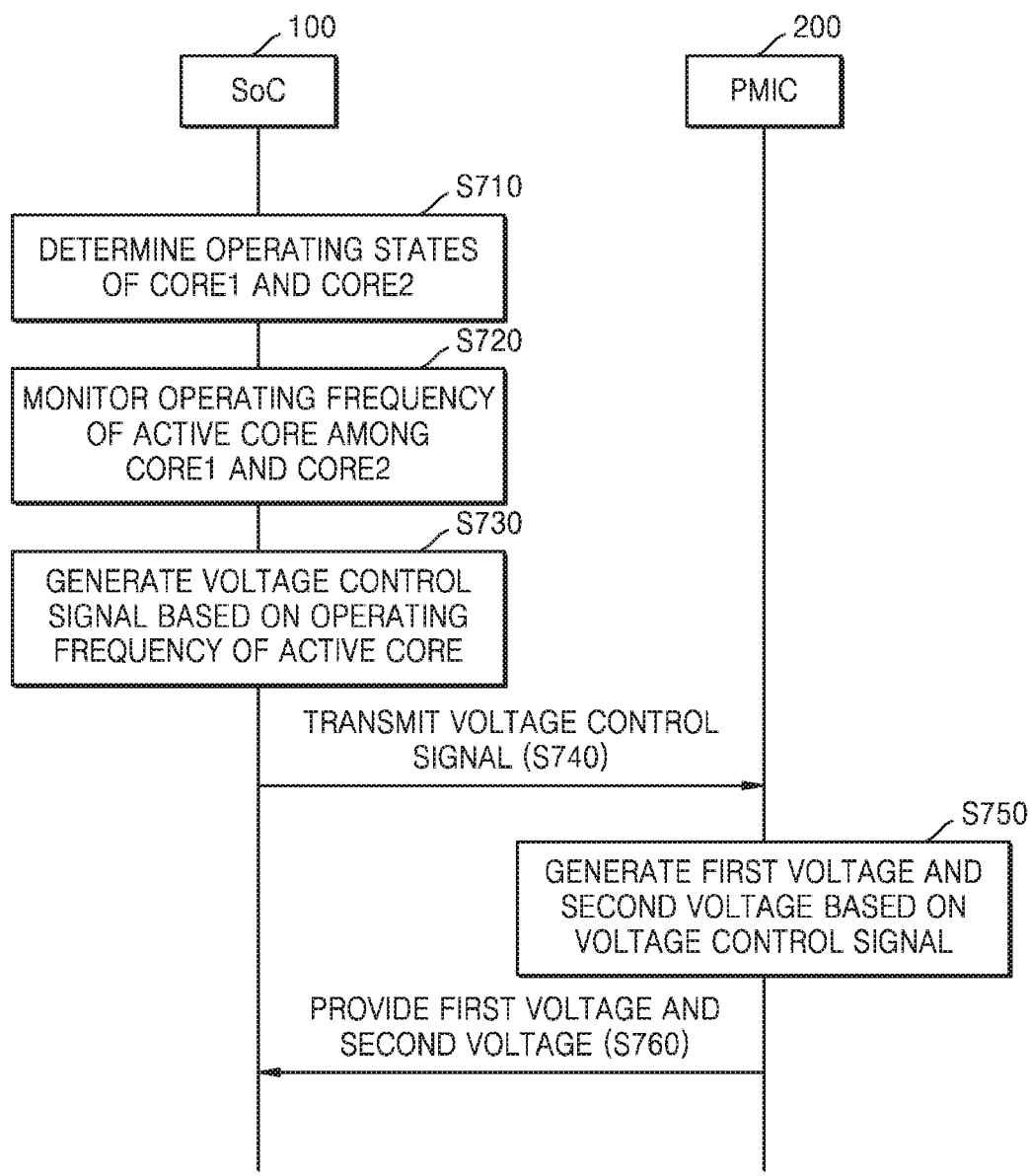
FIG. 7 is a flowchart of an operation between an SoC and a power management integrated circuit (PMIC), according to an embodiment.

FIG. 7 is a flowchart of an operation between the SoC 100 and the PMIC 200, according to an embodiment.

Referring to FIG. 7, the operation between the SoC 100 and the PMIC 200 for regulating a voltage level provided to each of a plurality of cores included in a multi-core processor is illustrated according to an embodiment, and the operation may include, for example, sequential operations performed between the SoC 100 and the PMIC 200 of FIG. 4. Hereinafter, the operation according to an embodiment will be described with reference to FIGS. 4 and 7 together.

In operation S710, the SoC 100 may determine operating states of the CORE1 110a and the CORE2 110b. In operation S720, the SoC 100 may monitor an operating frequency of an active core of the CORE1 110a and the CORE2 110b. In operation S730, the SoC 100 may generate a voltage control signal based on the operating frequency of the active core. For example, in some embodiments, the voltage control signal may include the first and second voltage control signals VCS1 and VCS2. In operation S740, the SoC 100 may transmit the voltage control signal to the PMIC 200. For example, in some embodiments, the voltage control signal may transmit the first and second voltage control signals VCS1 and VCS2 to the PMIC 200. In operation S750, the PMIC 200 may generate the first voltage V1 and the second voltage V2 based on the voltage control signal. In operation S760, the PMIC 200 may provide the first voltage V1 and the second voltage V2 to the SoC 100.

Figure 8:
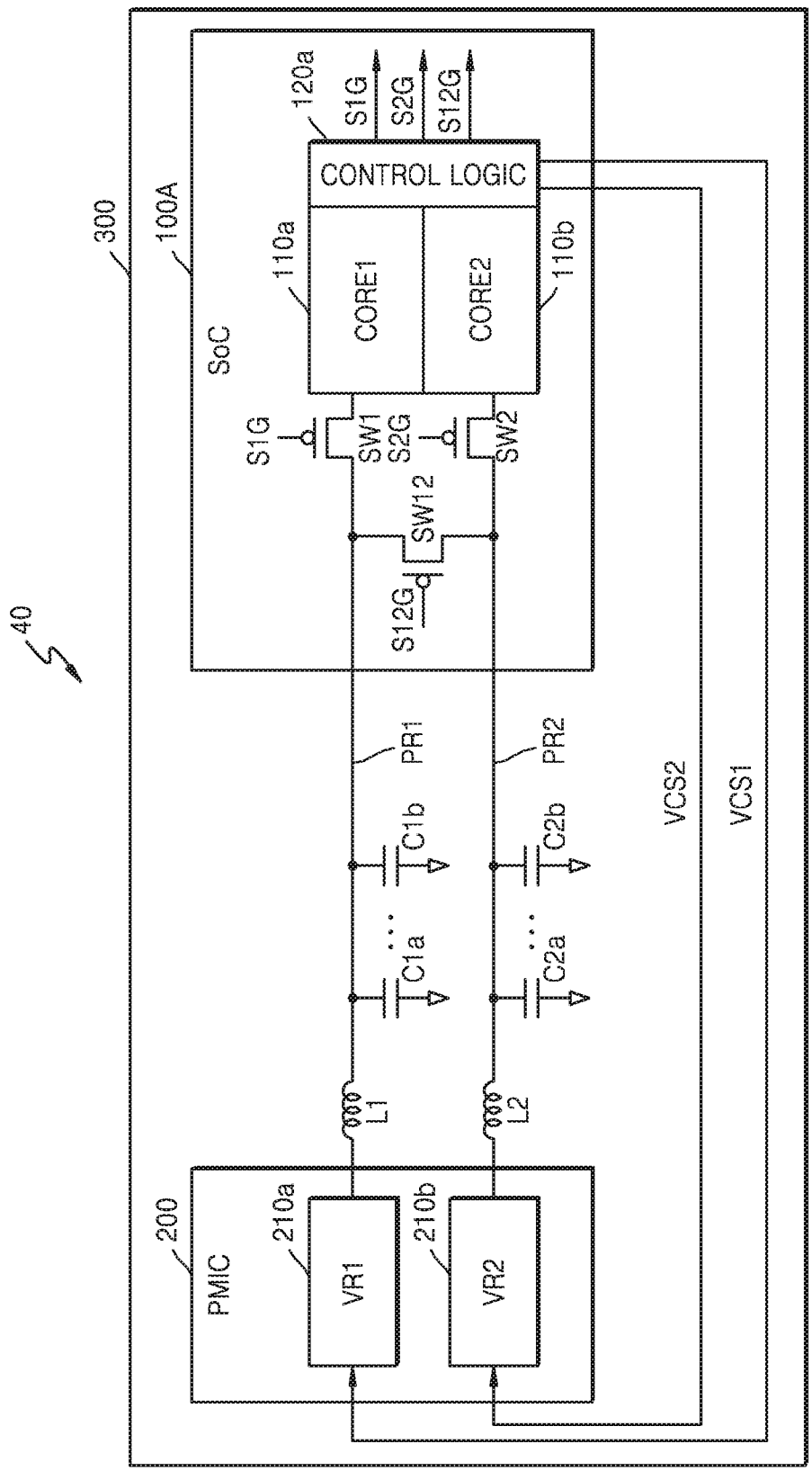
FIG. 8 shows an example of an electronic device including a first core and a second core, according to an embodiment.

FIG. 8 shows an example of an electronic device 40 including the CORE1 110a and the CORE2 110b, according to an embodiment.

Referring to FIG. 8, the electronic device 40 may include an SoC 100A and the PMIC 200 and the SoC 100A and the PMIC 200 may be mounted on a printed circuit board (PCB) 300. The SoC 100A may correspond to an embodiment of the SoC 100 of FIG. 4 and the PMIC 200 may correspond to the PMIC 200 of FIG. 4. The aspects described above with reference to FIGS. 1 through 7 may be applied to the embodiment of FIG. 8.

The VR1 210a may be connected to passive devices arranged on the PCB 300, for example, an inductor L1 and capacitors C1a and C1b. According to embodiments, the number of inductors L1 or an inductance and the number of capacitors C1a and C1b and a capacitance may be changed according to a current capacity of the VR1 210a. Likewise, the VR2 210b may be connected to passive devices arranged on the PCB 300, for example, an inductor L2 and capacitors C2a and C2b. According to embodiments, the number of inductors L2 or an inductance and the number of capacitors C2a and C2b and a capacitance may be changed according to a current capacity of the VR2 210b.

In detail, currents may be charged to the inductor L1 and the capacitors C1a and C1b, according to an output voltage of the VR1 210a. Thus, when an output voltage is increased according to an increase in current capacity of the VR1 210a, the inductance of the inductor L1 may be increased or the number of capacitors C1a and C1b may be increased. For example, assuming a case in which the SoC 100A does not include the first power switch SW12, the VR1 210a may be realized to have a current capacity (for example, 6 A) corresponding to maximum current consumption of the CORE1 110a. By contrast, the SoC 100A according to an embodiment includes the first power switch SW12, and thus, the SoC 100A may be realized to have a current capacity (for example, 4 A) corresponding to a half of total maximum current consumption of the CORE1 110a and the CORE2 110b. Therefore, according to an embodiment, without an increase in inductance of the inductor L1 or the increased number of capacitors C1a and C1b, per-core dynamic voltage management may be supported.

The SoC 100A may include the CORE1 110a and CORE2 110b, a control logic 120a, the first and second power gating switches SW1 and SW2, and the first power switch SW12. For example, each of the first and second power gating switches SW1 and SW2 and the first power switch SW12 may be realized as a PMOS transistor. However, embodiments are not limited thereto. For example, at least one of the first and second power gating switches SW1 and SW2 and the first power switch SW12 may be realized as an NMOS transistor or a transmission gate. For example, at least one of the first and second power gating switches SW1 and SW2 and the first power switch SW12 may be realized as a plurality of transistors connected in series, in parallel, or in series and parallel.

The control logic 120a may generate the first and second power gating signals S1G and S2G based on operating states of the CORE1 110a and the CORE2 110b. For example, when the CORE1 110a is in an active state, the control logic 120a may generate the first power gating signal S12G as logic "0." For example, when the CORE1 110a is in an idle state, the control logic 120a may generate the first power gating signal S12G as logic "1" and may power-gate the CORE1 110a.

The control logic 120a may generate the first power control signal S12G based on operating states and operating frequencies of the CORE1 110a and the CORE2 110b. For example, when only one of the CORE1 110a and CORE2 110b is in an active state and the operating frequency of the active core is higher than a reference frequency, the control logic 120a may generate the first power control signal S12G as an enable level, for example, logic "0." Accordingly, the first and second power rails PR1 and PR2 may be electrically connected to each other and power may be supplied to the active core from the VR1 210a and the VR2 210b.

The control logic 120a may generate the first voltage control signal VCS1 and the second voltage control signal VCS2 based on the operating states and the operating frequencies of the CORE1 110a and the CORE2 110b. For example, when the first power control signal S12G is logic "0," the control logic 120a may generate the first and second voltage control signalsVCS1 and VCS2 such that voltage levels of the first and second voltages V1 and V2 are the same as each other.

According to an embodiment, each of the SoC 100A and the PMIC 200 may be realized on a separate chip, and thus, the control logic 120a and the VR1 210a and VR2 210b may perform chip-to-chip communication. For example, the control logic 120a and the VR1 210a and the VR2 210b may communicate one another via an inter-integrated circuit (I2C), an improved inter-integrated circuit (I3C), a system power management interface (SPMI), general purpose input/output (GPIO), etc.

In detail, the control logic 120a may provide power gating state information of an idle core of the CORE1 110a and the CORE2 110b, current request information of an active core of the CORE1 110a and the CORE2 110b, output voltage information of the VR1 210a and the VR2 210b, etc. to the VR1 210a and VR2 210b, via a bus protocol. For example, when the CORE1 110a is in an active state and the CORE2 110b is in an idle state, the control logic 120a may provide the second voltage control signal VCS2 including power gating state information of the CORE2 110b, current request information indicating that the CORE1 110a requests a current equal to or greater than a current of 1/N (here, N is the number of cores), and output voltage information of the VR2 210b to the VR2 210b via chip-to-chip communication.

Figure 9:
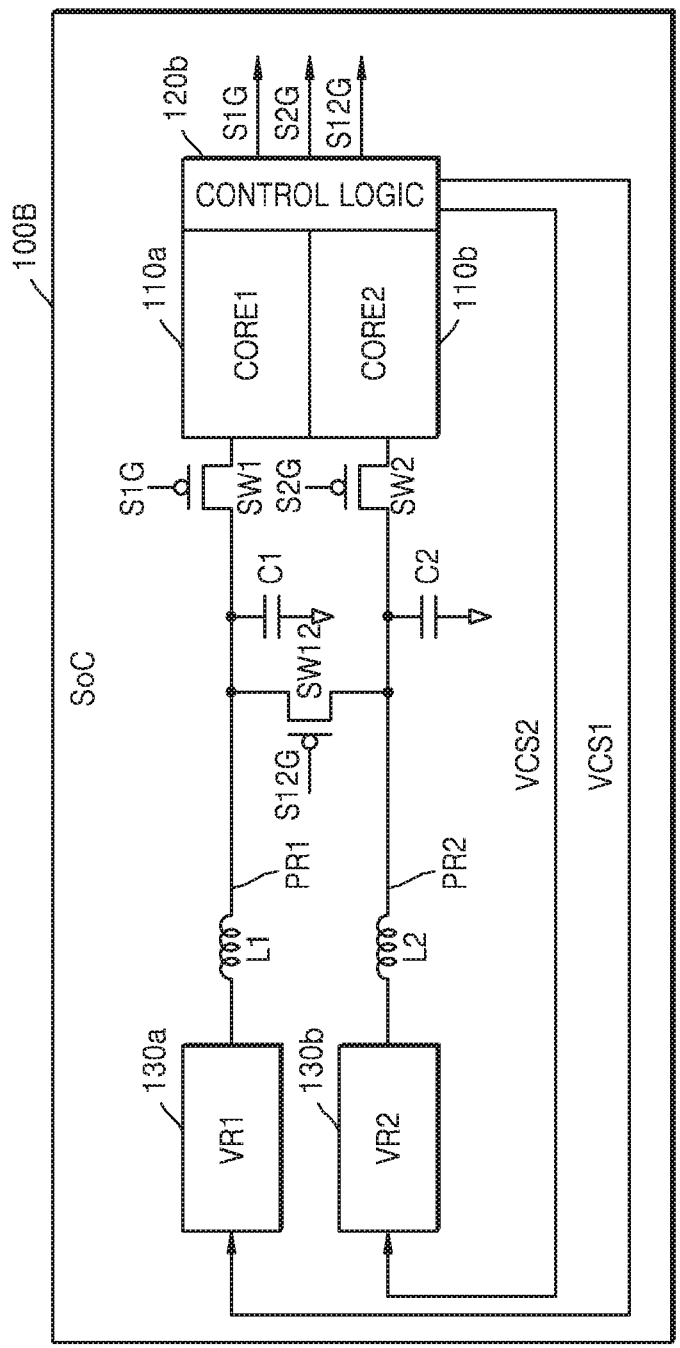
FIG. 9 shows an example of an SoC including a first core and a second core, according to an embodiment.

FIG. 9 shows an example of an SoC 100B including the CORE1 110a and the CORE2 110b, according to an embodiment.

Referring to FIG. 9, the SoC 100B may include the CORE1 110a and the CORE2 110b, a control logic 120b, the first and second power gating switches SW1 and SW2, the first power switch SW12, and a VR1 130a and a VR2 130b. The VR1 130a and the VR2 130b may correspond to the CORE1 110a and the CORE2 110b, respectively, and thus, the SoC 100B may support a per-core dynamic voltage management function. Also, the SoC 100B may further include the first and second inductors L1 and L2 and the first and second capacitors C1 and C2. The SoC 100B according to an embodiment corresponds to a modified embodiment of the SoC 100A of FIG. 8, and repeated descriptions of like elements will not be given for conciseness.

According to an embodiment, each of the VR1 130a and the VR2 130b may be realized as an integrated voltage regulator (IVR) or an on-chip voltage regulator and may be included in the SoC 100B. Thus, the control logic 120b may perform on-chip communication with the VR1 130a and the VR2 130b. For example, the control logic 120b and the VR1 130a and the VR2 130b may communicate one another via a bus protocol, such as an ARM peripheral bus (APB), an ARM high performance bus (AHB), etc. Alternatively, the control logic 120b and the VR1 130a and the VR2 130b may communicate one another via direct connection having a direct protocol, or based on an interface.

In detail, the control logic 120b may provide power gating state information of an idle core of the CORE1 110a and the CORE2 110b, current request information of an active core of the CORE1 110a and the CORE2 110b, output voltage information of the VR1 130a and the VR2 130b, etc. to the VR1 130a and VR2 130b, via a bus protocol. For example, when the CORE1 110a is in an active state and the CORE2 110b is in an idle state, the control logic 120b may provide the second voltage control signal VCS2 including power gating information of the CORE2 110b, current request information indicating that the CORE1 110a requests a current equal to or greater than a current of 1/N (here, N is the number of cores), and output voltage information of the VR2 130b to the VR2 130b via the bus protocol.

Figure 10:
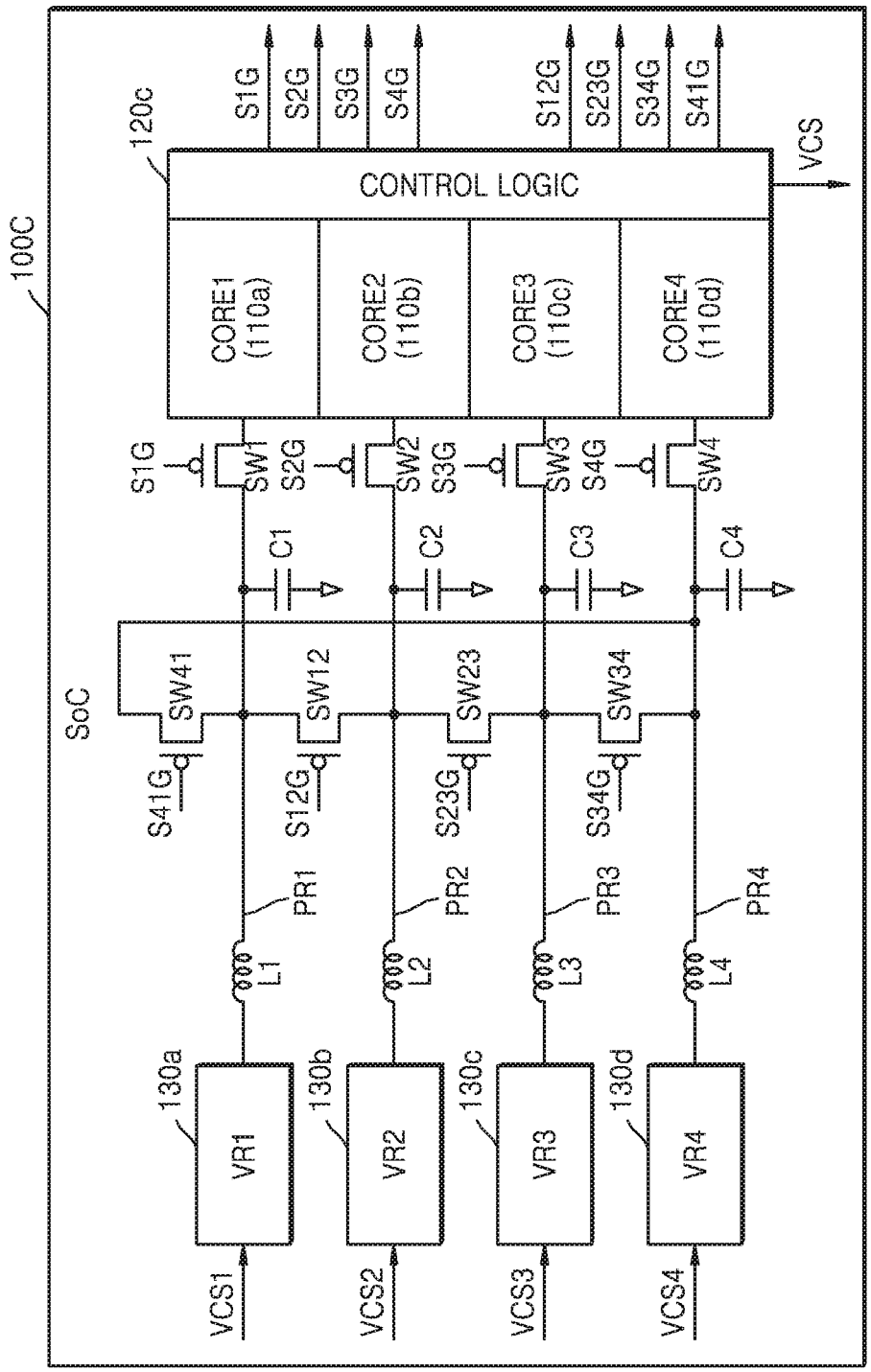
FIG. 10 shows an example of an SoC including a first core, a second core, a third core, and a fourth core according to an embodiment.

FIG. 10 shows an example of an SoC 100c including the CORE1 110a, the CORE2 110b, a CORE3 110c, and a CORE4 110d, according to an embodiment.

Referring to FIG. 10, the SoC 100C may include the CORE1 110a through the CORE4 110d, a control logic 120c, the first power gating switch SW1, the second power gating switch SW2, a third power gating switch SW3, and a fourth power gating switch SW4, the first power switch SW12, a second power switch SW23, a third power switch SW34, and a fourth power switch SW41, and the VR1 130a, the VR2 130b, a VR3 130c, and a VR4 130d. The VR1 130a through the VR4 130d may correspond to the CORE1 110a through the CORE4 110d, respectively, and thus, the SoC 100C may support a per-core dynamic voltage management function. Also, the SoC 100C may further include the first inductor L1, the second inductor L2, a third inductor L3, and a fourth inductor L4, and the first capacitor C1, the second capacitor C2, a third capacitor C3, and a fourth capacitor C4. The SoC 100C according to an embodiment corresponds to a modified embodiment of the SoC 100B of FIG. 9, and repeated descriptions of like elements will not be given.

The VR1 130a through the VR4 130d may be connected to the first through fourth inductors L1 through L4, respectively, and the first through fourth inductors L1 through L4 may charge currents based on output voltages of the VR1 130a through the VR4 130d, respectively. Also, the first through fourth capacitors C1 through C4 may provide voltages corresponding to currents flowing through the first power rail PR1, the second power rail PR2, a third power rail PR3, and a fourth power rail PR4, respectively, to the CORE1 110a through the CORE4 110d, respectively.

The first power gating switch SW1 may be arranged between the first power rail PR1 and the CORE1 110a and may electrically connect the first power rail PR1 to the CORE1 110a in response to the first power gating signal S1G. The second power gating switch SW2 may be arranged between the second power rail PR2 and the CORE2 110b and may electrically connect the second power rail PR2 to the CORE2 110b in response to the second power gating signal S2G. The third power gating switch SW3 may be arranged between the third power rail PR3 and the CORE3 110c and may electrically connect the third power rail PR3 to the CORE3 110c in response to a third power gating signal S3G. The fourth power gating switch SW4 may be arranged between the fourth power rail PR4 and the CORE4 110d and may electrically connect the fourth power rail PR4 to the CORE4 110d in response to a fourth power gating signal S4G.

The first power switch SW12 may be arranged between the first and second power rails PR1 and PR2 and may electrically connect the first and second power rails PR1 and PR2 to each other in response to the first power control signal S12G. The second power switch SW23 may be arranged between the second and third power rails PR2 and PR3 and may electrically connect the second and third power rails PR2 and PR3 to each other in response to a second power control signal S23G. The third power switch SW34 may be arranged between the third and fourth power rails PR3 and PR4 and may electrically connect the third and fourth power rails PR3 and PR4 to each other in response to a third power control signal S34G. The fourth power switch SW41 may be arranged between the fourth and first power rails PR4 and PR1 and may electrically connect the fourth and first power rails PR4 and PR1 to each other in response to a fourth power control signal S41G.

The control logic 120c may generate the first through fourth power gating signals 51G through S4G based on operating states of the CORE1 110a through the CORE4 110d. For example, when the CORE1 110a is in an active state and the CORE2 110b through the CORE4 110d are in an idle state, the control logic 120c may generate the first power gating signal S1G as logic "0" and the second through fourth power gating signals S2G through S4G as logic "1."

The control logic 120c may generate the first through fourth power control signals S12G through S41G based on the operating states and operating frequencies of the CORE1 110a through the CORE4 110d. According to an embodiment, when the operating frequency of an active core of the CORE1 110a through the CORE4 110d is higher than a first reference frequency and lower than a second reference frequency, the control logic 120c may generate the first through fourth power control signals S12G through S41G such that the one of power switches connectable to the active core is turned on. Also, according to an embodiment, when the operating frequency of the active core of the CORE1 110a through the CORE4 110d is higher than the first reference frequency and higher than the second reference frequency, the control logic 120c may generate the first through fourth power control signals S12G through S41G such that all power switches connectable to the active core are turned on.

For example, the first power gating switch SW1 may be electrically connected to the first, second, and fourth power rails PR1, PR2, and PR4, in response to the first power gating signal S1G and the first and fourth power control signals S12G and S41G. Accordingly, the CORE1 110a may receive power from three voltage regulators, that is, the VR1 130a, the VR2 130b, and the VR4 130d. Thus, when maximum current consumption of each CORE is 8 A, the current capacity of each of the VR1 130a through the VR4 130d may be, for example, 2.7 A.

The control logic 120c may generate the voltage control signal VCS including power gating state information of an idle core of the CORE1 110a through the CORE4 110d, current request information of an active core of the CORE1 110a through the CORE4 110d, output voltage information of the VR1 130a through the VR4 130d, etc. For example, the voltage control signal VCS may include the first voltage control signal VCS1, the second voltage control signal VCS2, a third voltage control signal VCS3, and a fourth voltage control signal VCS4 and the first through fourth voltage control signals VCS1 through VCS4 may be provided to the VR1 130a through the VR4 130d, respectively.

According to an embodiment, each of the VR1 130a through the VR4 130d may be realized as an IVR or an on-chip voltage regulator, and may be included in the SoC 100C. Here, the VR1 130a through the VR4 130d may perform on-chip communication with the control logic 120c. However, embodiments are not limited thereto. According to one or more embodiments, the VR1 130a through the VR4 130d may be arranged outside the SoC 100C. For example, the VR1 130a through the VR4 130d may be included in the PMIC. Here, the VR1 130a through the VR4 130d may perform chip-to-chip communication with the control logic 120c.

FIG. 11 is a table 50 showing an example of operations of the first through fourth power switches SW12 through SW14 based on operating states of the CORE1 110a through the CORE4 110d of FIG. 10, according to an embodiment.

Referring to FIGS. 10 and 11 together, the operating states of each of the CORE1 110a through the CORE4 110d may include an active state and an idle state. A power gating switch connected to an active core of the CORE1 110a through the CORE4 110d may be turned on, and thus, the active core may normally receive a power supply. A power gating switch connected to an idle core of the CORE1 110a through the CORE4 110d may be turned off, and thus, the idle core may be power gated and power consumption of the idle core may be reduced.

When all of the cores CORE1 110a through the CORE4 110d are in an active state or are in an idle state, all of the first through fourth power switches SW12 through SW41 may be turned off. When some of the CORE1 110a through the CORE4 110d are in an active state, at least one power switch among the first through fourth power switches SW12 through SW41, the power switch being connectable to the active cores, may be selectively turned on based on operating frequencies of the active cores.

For example, when only the CORE1 110a is in an active state and the operating frequency of the CORE1 110a is higher than a first reference frequency and lower than a second reference frequency, one of the first and fourth power switches SW12 and SW41 may be turned on. For example, when the first power switch SW12 is turned on, both of the VR1 130a and VR2 130b may be electrically connected to the CORE1 110a and a current that is greater than a current capacity of the VR1 130a may be provided to the CORE1 110a. For example, when the fourth power switch SW41 is turned on, both of the VR1 130a and the VR4 130d may be electrically connected to the CORE1 110a and a current that is greater than a current capacity of the VR1 130a may be provided to the CORE1 110a.

For example, when only the CORE1 110a is in an active state and the operating frequency of the CORE1 110a is higher than the first reference frequency and higher than the second reference frequency, both of the first and fourth power switches SW12 and SW41 may be turned on. Accordingly, all of the VR1 130a, the VR2 130b, and the VR4 130d may be electrically connected to the CORE1 110a and a current greater than a current capacity of the VR1 130a may be provided to the CORE1 110a. When the operating frequency of the CORE1 110a is lower than the first reference frequency, all of the first through fourth switches SW12 through SW41 may be turned off.

In this configuration, in order to support per-core dynamic voltage management, one voltage regulator may be divided into the VR1 130a through the VR4 130d. When the per-core dynamic voltage management is not supported, a current capacity of a single voltage regulator may correspond to total maximum current consumption of the CORE1 110a through the CORE4 110d. However, when the per-core dynamic voltage management is supported, a current capacity of each of the VR1 130a through the VR4 130d may be determined based on current consumption of each of the CORE1 110a through the CORE4 110d. Here, the maximum current consumption of each of the CORE1 110a through the CORE4 110d may be greater than ¼ of the total maximum current consumption (for example, 8 A) of the CORE1 110a through the CORE4 110d.

According to an embodiment, the SoC 100C may include the first through fourth power switches SW12 through SW41, and thus, the current capacity of each of the VR1 130a through the VR4 130d may be determined as a value equal to or greater than ⅓ of the total maximum current consumption of the CORE1 110a through the CORE4 110d. For example, the current capacity of each of the VR1 130a through the VR4 130d may be 2.7 A.

Figure 12:
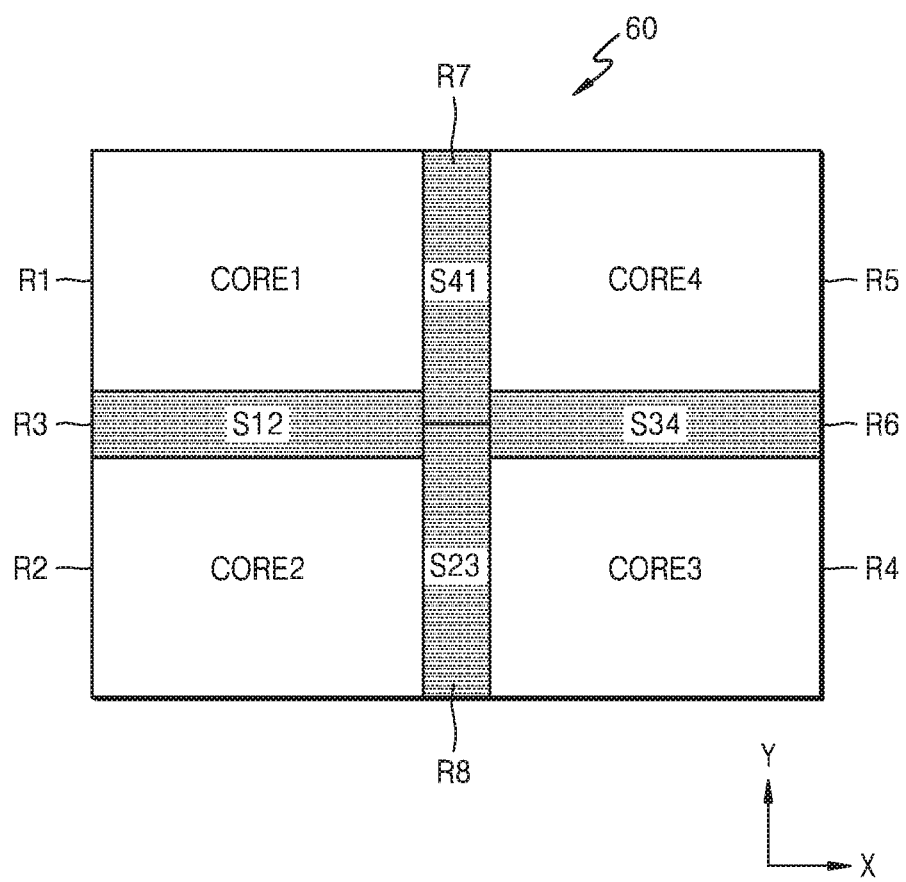
FIG. 12 is a layout of a multi-core processor including a first core, a second core, a third core, and a fourth core, according to an embodiment.

FIG. 12 is a layout 60 of a multi-core processor including CORE1 through the CORE4, according to an embodiment.

Referring to FIG. 12, the layout 60 of the multi-core processor may, for example, correspond to a portion of the layout of the SoC 100C of FIG. 10. The layout 60 of the multi-core processor may include a first region R1, a second region R2, a third region R3, a fourth region R4, a fifth region R5, a sixth region R6, a seventh region R7, and an eighth region R8. Here, the first through third regions R1 through R3 may be adjacent to one another in a Y direction, the fourth through sixth regions R4 through R6 may be adjacent to one another in the Y direction, and the seventh and eighth regions R7 and R8 may be adjacent to each other in the Y direction.

The CORE1 may be arranged in the first region R1 and the CORE2 may be arranged in the second region R2. The CORE3 may be arranged in the fourth region R4 and the CORE4 may be arranged in the fifth region R5. Each of the first through fourth regions R1 through R4 may have a certain area extending in an X direction and the Y direction. The areas may be the same size or different sizes from one another.

The first power switch SW12 may be arranged in the third region R3 between the first and second regions R1 and R2. The second power switch SW23 may be arranged in the eighth region R8 between the second and fourth regions R2 and R4. The third power switch SW34 may be arranged in the sixth region R6 between the fourth and fifth regions R4 and R5. The fourth power switch SW41 may be arranged in the seventh region R7 between the first and the fifth regions R1 and R5.

Figure 13:
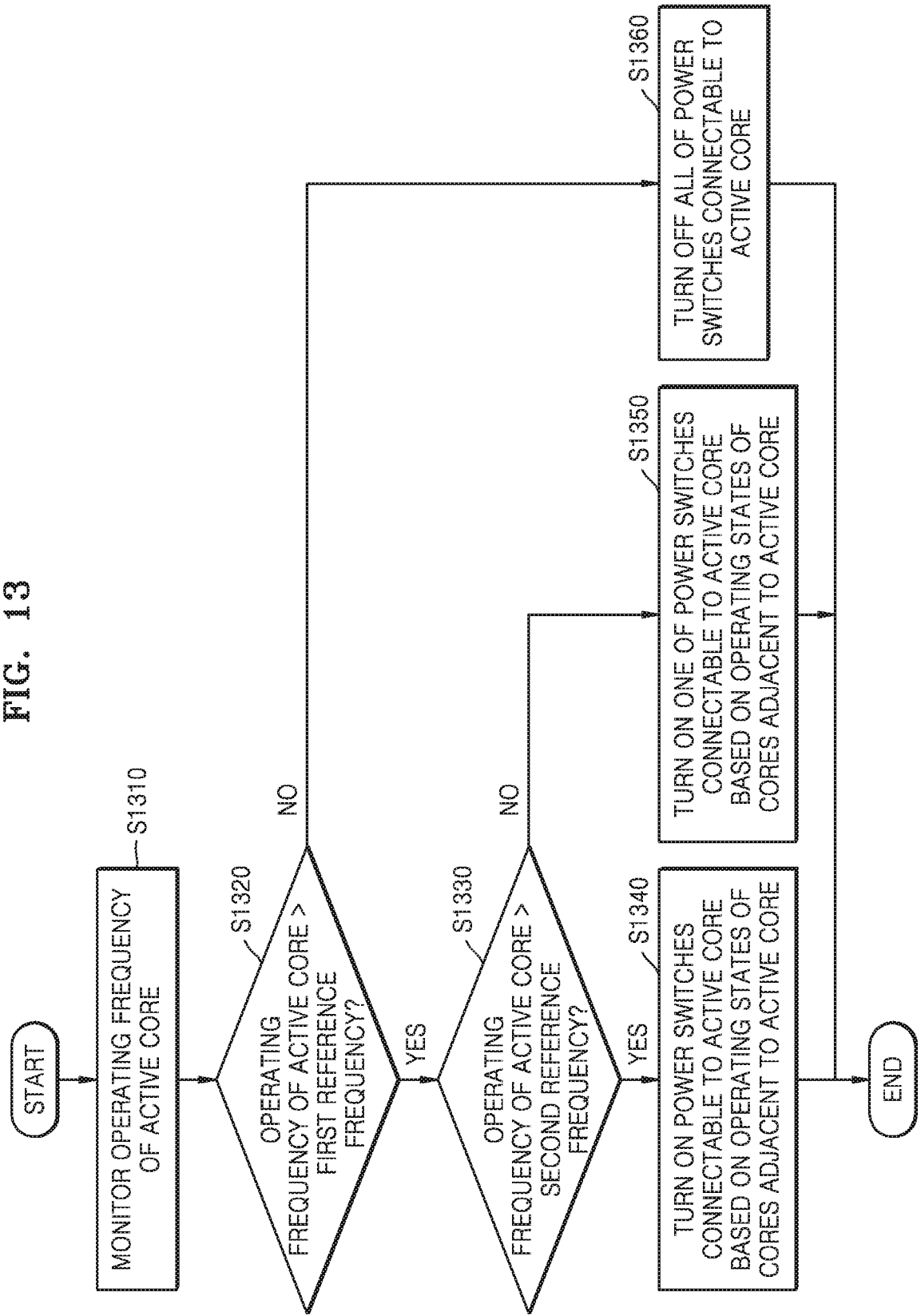
FIG. 13 is a detailed flowchart of an operating method of an SoC, according to an embodiment.

FIG. 13 is a detailed flowchart of an operating method of an SoC, according to an embodiment.

Referring to FIG. 13, the operating method of the SoC according to an embodiment may be an operating method for regulating a voltage level provided to each of a plurality of cores included in a multi-core processor, and may include, for example, sequential operations performed on the SoC 100C of FIG. 10. According to an embodiment, operations of power switches may be controlled based on an operating frequency of an active core. However, it is only an embodiment and embodiments are not limited thereto. Hereinafter, the operation of the SoC according to an embodiment will be described with reference to FIGS. 10 and 13 together.

In operation S1310, the control logic 120c may monitor the operating frequency of an active core. For example, the active core may be the CORE1 110a. In operation S1320, the control logic 120c may determine whether the operating frequency of the active core is higher than a first reference frequency. For example, when the CORE1 110a performs a high performance operation or a high speed operation, the operating frequency of the CORE1 110a may be higher than the first reference frequency. Here, the first reference frequency may be defined as a frequency at which an active core requests a current greater than a current capacity of a single voltage regulator.

Based on a result of the determining, when the operating frequency is higher than the first reference frequency (operation S1320, YES), operation S1330 may be performed. In operation S1330, the control logic 120c may determine whether the operating frequency of the active core is higher than a second reference frequency. Here, the second reference frequency may be higher than the first reference frequency. For example, when the CORE1 110a performs an ultra-high performance operation or an ultra-high speed operation, the operating frequency of the CORE1 110a may be higher than the second reference frequency. Here, the second reference frequency may be defined as a frequency at which an active core requests a current greater than a total current capacity of two voltage regulators.

Based on a result of the determining, when the operating frequency is higher than the second reference frequency (operation S1330), the control logic 120c may turn on power switches connectable to the active core, based on operating states of cores adjacent to the active core, in operation S1340. That is, the control logic 120c may turn on power switches of all adjacent cores to the active core, based on the operating states of the cores adjacent to the active core. For example, the control logic 120c may turn on the first and fourth power switches SW12 and SW41 connectable to the CORE1 110a, based on the operating states of the CORE2 110b and the CORE4 110d adjacent to the CORE1 110a. For example, when both of the CORE2 110b and the CORE4 110d are in an idle state, the control logic 120c may turn on the first and fourth power switches SW12 and SW41.

When the operating frequency is higher than the first reference frequency and not higher than the second reference frequency (operation S1330, NO), the control logic 120c may turn on one of the power switches connectable to the active core, based on the operating states of the cores adjacent to the active core, in operation S1350. That is, the control logic 120c may turn on the power switch of one of the adjacent cores to the active core, based on the operating states of the cores adjacent to the active core. For example, the control logic 120c may turn on one of the first and fourth power switches SW12 and SW41 connectable to the CORE1 110a, based on the operating states of the CORE2 110b and the CORE4 110d adjacent to the CORE1 110a. For example, when the CORE2 110b is in an active state and the CORE4 110d is in an idle state, the control logic 120c may turn on the fourth power switch SW41.

When the operating frequency is not higher than the first reference frequency (operation S1320, NO), the control logic 120c may turn off all of the power switches connectable to the active core, in operation S1360. That is, the control logic 120c may turn off the power switches of the adjacent cores to the active core. Accordingly, when the operating frequency of the CORE1 110a is not higher than the first reference frequency, the current required for an operation of the CORE1 110a may be equal to or less than the current capacity of the VR1 130a. For example, the control logic 120c may turn off both of the first and fourth power switches SW12 and SW41 connectable to the CORE1 110a.

Figure 14:
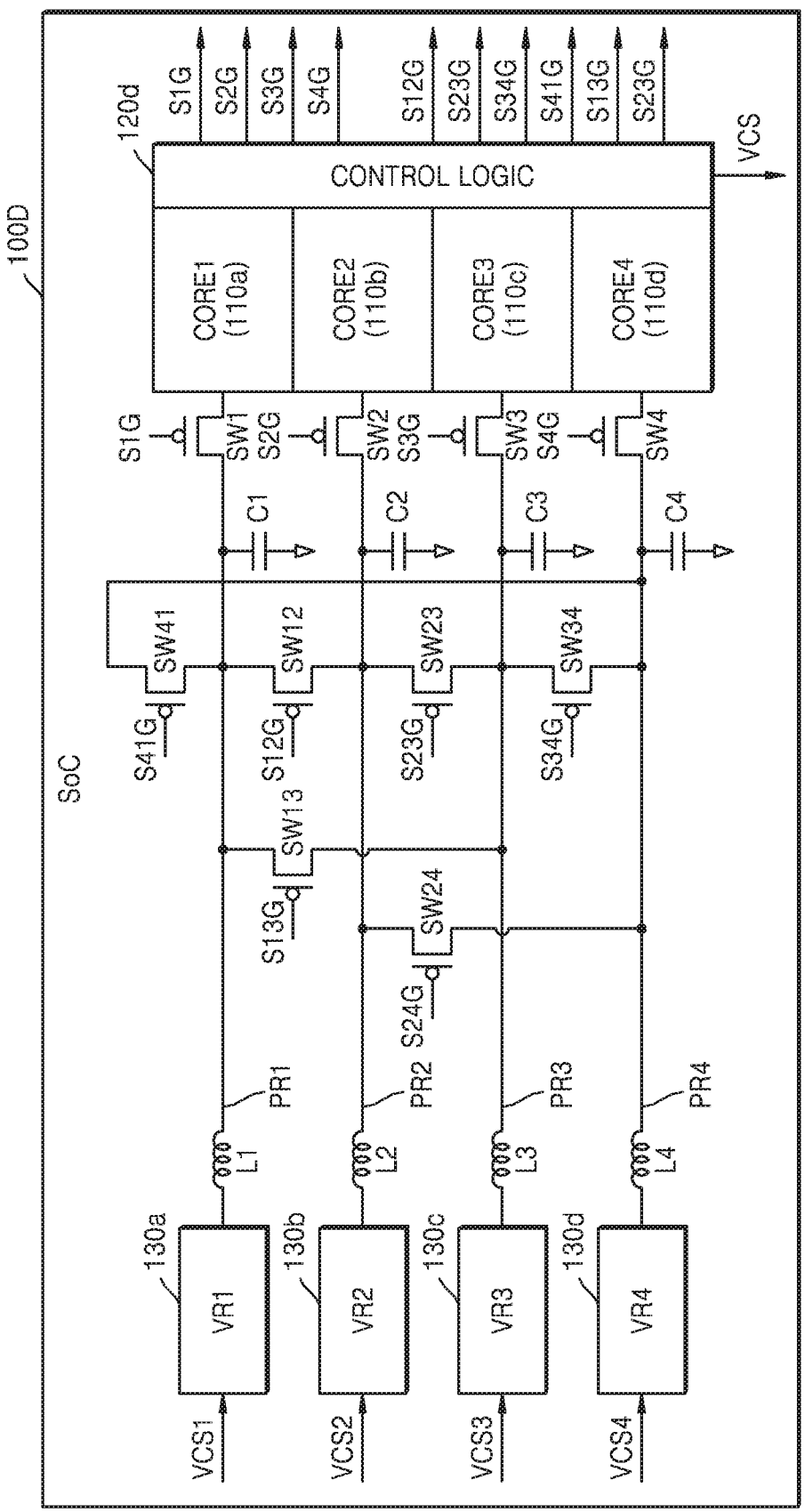
FIG. 14 shows an example of an SoC including a first core, a second core, a third core, and a fourth core according to another embodiment.

FIG. 14 shows another example of an SoC 100D including the CORE1 110a through the CORE4 110d, according to an embodiment.

Referring to FIG. 14, the SoC 100D may include the CORE1 110a through the CORE4 110d, a control logic 120d, the first through fourth power gating switches SW1 through SW4, the first power switch SW12, the second power switch SW23, the third power switch SW34, the fourth power switch SW41, a fifth power switch SW13, and a sixth power switch SW24, and the VR1 130a through the VR4 130d. The VR1 130a through the VR4 130d may correspond to the CORE1 110a through the CORE4 110d, respectively, and thus, the SoC 100D may support a per-core dynamic voltage management function. Also, the SoC 100D may further include the first through fourth inductors L1 through L4 and the first through fourth capacitors C1 through C4. The SoC 100D according to an embodiment corresponds to a modified embodiment of the SoC 100C of FIG. 10, and repeated descriptions of like elements will not be given.

The fifth power switch SW13 may be arranged between the first and third power rails PR1 and PR3 and may electrically connect the first and third power rails PR1 and PR3 to each other in response to a fifth power control signal S13G. The sixth power switch SW24 may be arranged between the second and fourth power rails PR2 and PR4 and may electrically connect the second and fourth power rails PR2 and PR4 to each other in response to a sixth power control signal S24G.

For example, the first power gating switch S1 may be electrically connected to the first through fourth power rails PR1 through PR4, in response to the first power gating signal S1G and the first, fourth and fifth power control signals S12G, S41G, and S13G. Accordingly, the CORE1 110a may receive power from maximum four voltage regulators, that is, the VR1 130a through the VR4 130d. Thus, when maximum current consumption of each CORE is 8 A, the current capacity of each of the VR1 130a through the VR4 130d may be, for example, 2 A.

The control logic 120D may generate a voltage control signal VCS including power gating state information of an idle core of the CORE1 110a through the CORE4 110d, current request information of an active core of the CORE1 110a through the CORE4 110d, output voltage information of the VR1 130a through the VR4 130d, etc. For example, in some embodiments, the voltage control signal VCS may include the first through fourth voltage control signals VCS1 through VCS4, and the first through fourth voltage control signals VCS1 through VCS4 may be provided to the VR1 130a through the VR4 130d, respectively.

According to an embodiment, each of the VR1 130a through the VR4 130d may be realized as an IVR or an on-chip voltage regulator, and may be included in the SoC 100D. Here, the VR1 130a through the VR4 130d may perform on-chip communication with the control logic 120d. However, embodiments are not limited thereto. According to one or more embodiments, the VR1 130a through the VR4 130d may be arranged outside the SoC 100D and may be, for example, included in the PMIC 200. Here, the VR1 130a through the VR4 130d may perform chip-to-chip communication with the control logic 120d.

Figure 15:
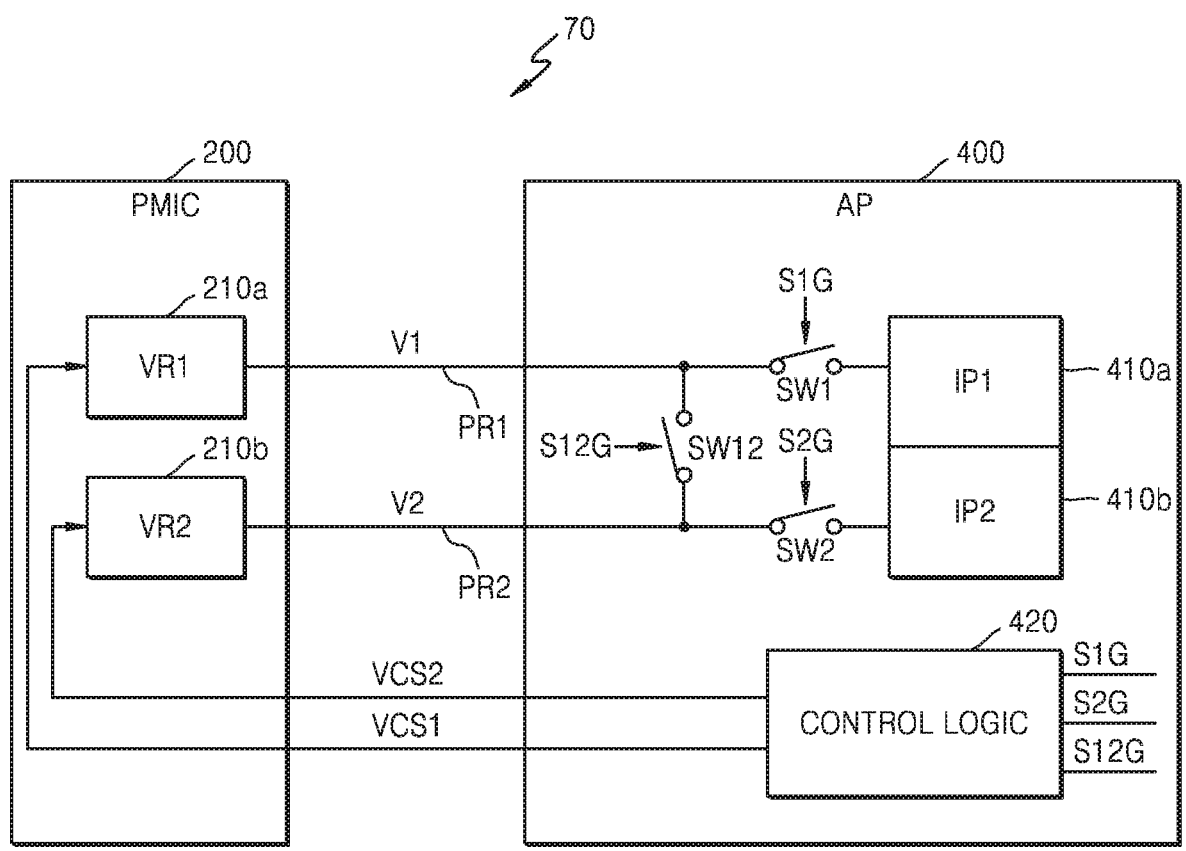
FIG. 15 is a block diagram of an electronic device according to an embodiment.

FIG. 15 is a block diagram of an electronic device 70 according to an embodiment.

Referring to FIG. 15, the electronic device 70 may include the PMIC 200 and an application processor (AP) 400 and the AP 400 may include a first intellectual property (IP10) 410a, a second intellectual property (IP2) 410b, and a control logic 420. In this specification, the term "intellectual property" may denote an intellectual property block or core, where the IP block is a reusable unit of logic, cell or integrated circuit that is the intellectual property of one entity. For example, in some embodiments, the intellectual property block may be considered a functional block as described below. According to an embodiment, the PMIC 200 and the AP 400 may be integrated into the same chip, and may be realized, for example, as an SoC. According to an embodiment, the PMIC 200 and the AP 400 may be separately realized on different chips. According to an embodiment, the PMIC 200 and the AP 400 may be realized in the same package, and for example, may be realized as an SIP. The AP 400 according to an embodiment may correspond to a modified embodiment of the SoC 100 of FIG. 4, and repeated descriptions of like elements will not be given.

The IP1 410a and the IP2 410b may be functional blocks pre-designed and each performing a certain function. According to an embodiment, the IP1 410a and the IP2 410b may independently operate under control of the control logic 420. The VR1 210a may be connected to the IP1 410a via the first power rail PR1 and may provide the first voltage V1 to the IP1 410a. The VR2 210b may be connected to the IP2 410b via the second power rail PR2 and may provide the second voltage V2 to the IP2 410b.

Also, the AP 400 may further include the first and second power gating switches SW1 and SW2 and the first power switch SW12. The first power gating switch SW1 may be arranged between the first power rail PR1 and the IP1 410a and may be selectively turned on in response to the first power gating signal S1G. The second power gating switch SW2 may be arranged between the second power rail PR2 and the IP2 410b and may be selectively turned on in response to the second power gating signal S2G. The first power switch SW12 may be arranged between the first power rail PR1 and the second power rail PR2 and may be driven in response to the first power control signal SW12G. For example, when the first power control signal SW1G is enabled, the first power switch SW12 may be turned on and may connect the IP1 410a or the IP2 410b to both of the first and second power rails PR1 and PR2.

The control logic 420 may generate the first and second power gating signals S1G and S2G and the first power control signal S12G and may generate a voltage control signal for controlling voltage levels of the first and second voltages V1 and V2, based on operating states and operating frequencies of the IP1 410a and the IP2 410b. According to an embodiment, when the IP1 410a is in an active state and the IP2 410b is in an idle state, and when the operating frequency of the IP1 410a is higher than a reference frequency or an operating voltage of the IP1 410a is greater than the first voltage V1 provided by the VR1 210a, the first power control signal S12G may be enabled to turn on the first power switch SW12. Here, when the first power control signal S12G is enabled, the voltage levels of the first and second voltages V1 and V2 may be the same as each other.

Figure 16:
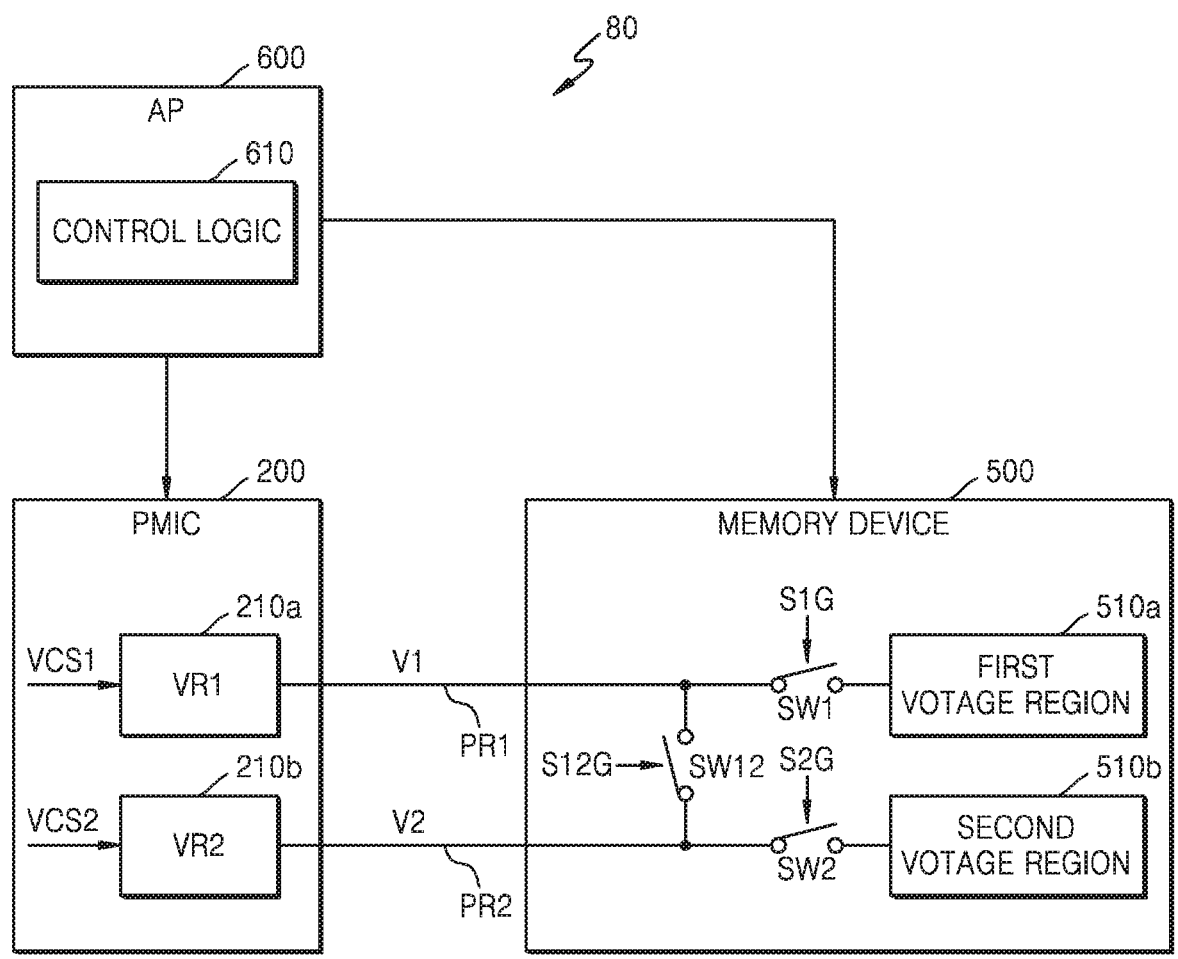
FIG. 16 is a block diagram of an electronic device according to an embodiment.

FIG. 16 is a block diagram of an electronic device 80 according to an embodiment.

Referring to FIG. 16, the electronic device 80 may include the PMIC 200, a memory device 500, and an AP 600. The memory device 500 may include a first voltage region 510a and a second voltage region 510b and the PMIC 200 may include the VR1 210a and the VR2 210b corresponding to the first voltage region 510a and the second voltage region 510b, respectively.

The memory device 500 may further include the first and second power gating switches SW1 and SW2. The first power gating switch SW1 may be arranged between the first power rail PR1 and the first voltage region 510a and may electrically connect the first power rail PR1 to the first voltage region 510a in response to the first power gating signal S1G. The second power gating switch SW2 may be arranged between the second power rail PR2 and the second voltage region 510b and may electrically connect the second power rail PR2 to the second voltage region 510b in response to the second power gating signal S2G.

Also, the memory device 500 may further include the first power switch SW12. The first power switch SW12 may be arranged between the first power rail PR1 and the second power rail PR2 and may electrically connect the first power rail PR1 with the second power rail PR2 in response to the first power control signal S12G. For example, when the first voltage region 510a is in an active state and the second voltage region 510b is in an idle state, the first power switch SW12 may be selectively turned on. Accordingly, power may be supplied to the first voltage region 510a from the VR1 210a and the VR2 210b.

The memory device 500 may include various circuit blocks related to a memory operation. Here, the first voltage region 510a may include one or more of various circuit blocks and the second voltage region 510b may include the others of various circuit blocks. For example, the first voltage region 510a may include one or more data processing blocks configured to transmit data to be written to the memory device 500 or data read from the memory device 500. For example, the second voltage region 510b may include at least one control block configured to control the data processing blocks included in the first voltage region 510a.

According to an embodiment, the first voltage region 510a may receive the first voltage V1 from the VR1 210a or receive a voltage higher than the first voltage V1 from the VR1 210a and the VR2 210b, based on an operating mode. For example, when the first voltage region 510a is in low power mode, the first power control signal S12G may be disabled, and thus, the first power switch SW12 may be turned off. For example, when the first voltage region 510a is in a normal power mode, in other words, when the first voltage region 510a requires an operating voltage, a voltage level of which is higher than the voltage level of the first voltage V1, the first power control signal S12G may be enabled, and thus, the first power switch SW12 may be turned on.

The AP 600 may include a control logic 610, wherein the control logic 610 may generate the first and second power gating signals S1G and S2G, the first power control signal S12G, and the first and second voltage control signals VCS1 and VCS2. However, embodiments are not limited thereto. According to another embodiment, a control logic generating the first and second power gating signals S1G and S2G, the first power control signal S12G, and the first and second voltage control signals VCS1 and VCS2 may be included in the memory device 500.

Figure 17:
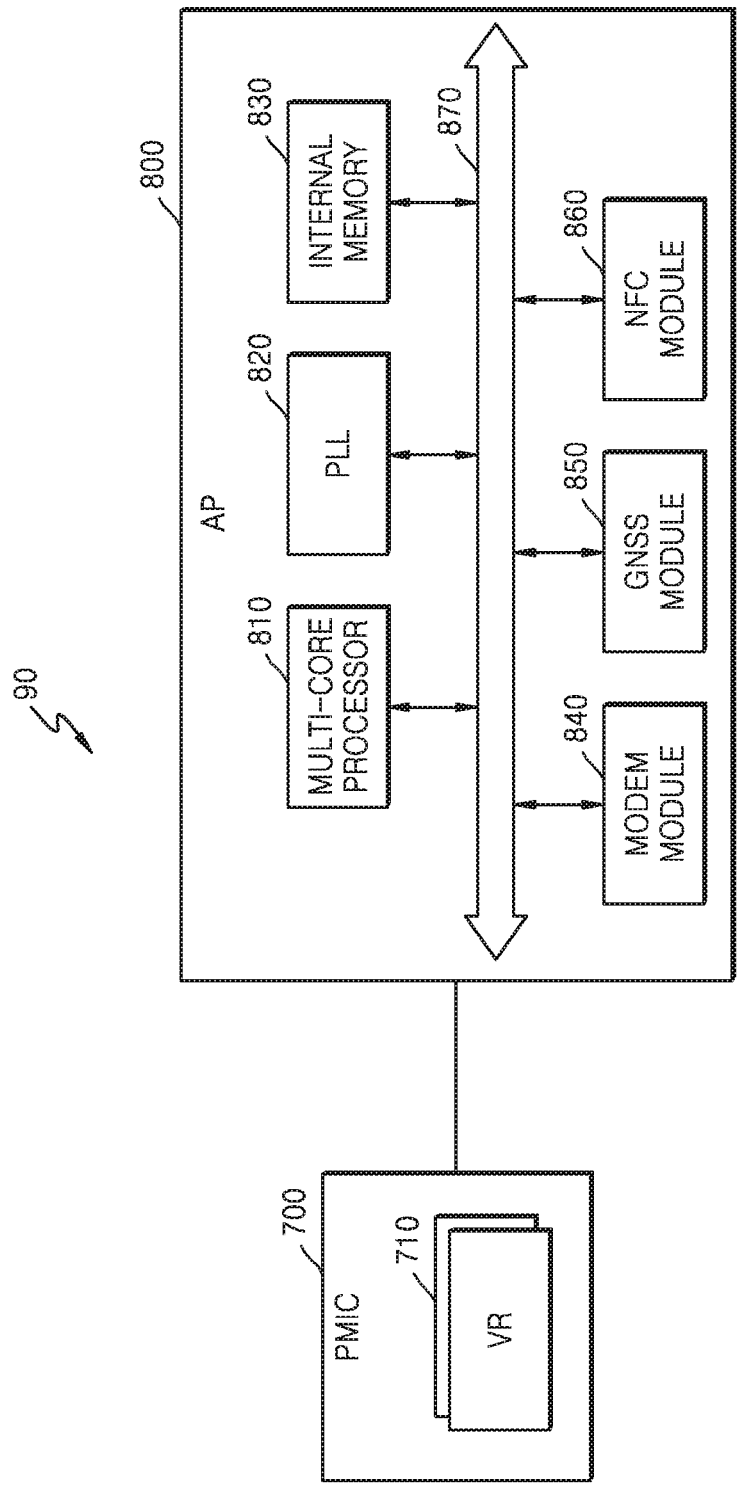
FIG. 17 is a block diagram of an electronic device according to an embodiment.

FIG. 17 is a block diagram of an electronic device 90 according to an embodiment.

Referring to FIG. 17, the electronic device 90 may include a PMIC 700 and an AP 800. The AP 800 may include a multi-core processor 810 according to various embodiments described above. The multi-core processor 810 may control functions of the AP 800 by executing various programs. The PMIC 700 may include a plurality of voltage regulators (VR) 710 and the plurality of voltage regulators 710 may correspond to a plurality of cores in the multi-core processor 810, respectively. Thus, the PMIC 700 may support a per-core dynamic voltage management function.

The AP 800 may further include a modem module 840, and thus, the AP 800 may be referred to as a modem AP (ModAP). The AP 800 may be realized as an SoC and may further include various types of circuit blocks. For example, the AP 800 may further include a PLL 820 and an internal memory 830. Also, the AP 800 may further include a global navigation satellite system (GNSS) module 850 and another type of communication module, for example, a near field communication (NFC) module 860. The AP 800 may further include various types of communication modules, such as WLAN, BT, etc., in addition to the components illustrated in FIG. 17. The components included in the AP 800 may communicate with one another via a bus 870.

Various programs for controlling the operation of the AP 800 may be stored in the internal memory 830 and the program may be executed by various types of processors, such as the multi-core processor 810, a processor included in the modem module 840, a processor included in the GNSS module 850, etc. The PLL 820 may include a clock generator and the PLL 820 may provide clock outputs to the modem module 840, the GNSS module 850, and the NFC module 860. Also, although FIG. 17 illustrates that one PLL 820 is included in the AP 800, in some embodiments a plurality of PLLs may be included in the AP 800. The PLL 820 may support the per-core dynamic frequency management function.

Example embodiments are disclosed in the drawings and the specification as described above. Embodiments are described by using specific terms in this specification. However, the terminology used herein is for the purpose of describing particular embodiments only and is not intended to be limiting of example embodiments. Accordingly, it should be understood that there can be many equivalents and modified embodiments that can substitute those described in this specification. Therefore, the scope of the embodiments should be defined by the appended claims.

While the inventive concept has been particularly shown and described with reference to embodiments thereof, it will be understood that various changes in form and details may be made therein without departing from the spirit and scope of the following claims.

What is claimed is:

1. A system on chip (SoC) comprising:
a plurality of cores including a first core and a second core;
a first power gating switch which is arranged between the first core and a first power rail that receives a first voltage, the first power gating switch being selectively turned on in response to a first power gating signal;
a second power gating switch which is arranged between the second core and a second power rail that receives a second voltage, the second power gating switch being selectively turned on in response to a second power gating signal; and
a first power switch which is arranged between the first power rail and the second power rail, and is selectively turned on in response to a first power control signal to connect the first power gating switch or the second power gating switch to both the first power rail and the second power rail,
wherein the first power switch is selectively turned on based on an operating frequency or an operating voltage of an active core among the first core and the second core, so that the active core is connected to both the first power rail and the second power rail through one of the first power gating switch and the second power gating switch, which is connected to the active core, and the first power switch.

2. The SoC of claim 1, wherein,
when the first core is in an active state and the second core is in an idle state,
the first power gating switch is turned on to electrically connect the first power rail with the first core, and
the second power gating switch is turned off to electrically insulate the second power rail from the second core.

3. The SoC of claim 1, wherein,
when the first core is in an active state and the second core is in an idle state, and
when the operating frequency of the first core is higher than a reference frequency or the operating voltage of the first core is greater than the first voltage,
the first power control signal is enabled to turn on the first power switch to connect the first power gating switch to both the first power rail and the second power rail.

4. The SoC of claim 1, wherein,
when the first power control signal is enabled, a voltage level of the first voltage is the same as a voltage level of the second voltage.

5. The SoC of claim 1, wherein
a voltage level of the first voltage and a voltage level of the second voltage are variable based on at least one of operating states, operating frequencies, and workloads of the first core and the second core.

6. The SoC of claim 1, wherein
the first power gating signal and the second power gating signal and the first power control signal are controlled based on at least one of operating states, operating frequencies, and workloads of the first core and the second core.

7. The SoC of claim 1, further comprising
a control logic configured to generate the first power gating signal and the second power gating signal and the first power control signal, based on operating states and operating frequencies of the first core and the second core.

8. The SoC of claim 1, further comprising
a control logic configured to generate a voltage control signal for controlling voltage levels of the first voltage and the second voltage.

9. The SoC of claim 8, wherein
the control logic is further configured to provide the voltage control signal to a power management integrated circuit (PMIC) arranged outside the SoC, via chip-to-chip communication.

10. The SoC of claim 8, further comprising:
a first voltage regulator corresponding to the first core and configured to provide the first voltage to the first power rail; and
a second voltage regulator corresponding to the second core and configured to provide the second voltage to the second power rail,
wherein the control logic is further configured to provide the voltage control signal to the first voltage regulator and the second voltage regulator via on-chip communication.

11. The SoC of claim 1, wherein
the plurality of cores further include a third core and a fourth core, and
the SoC further comprises:
a third power gating switch which is arranged between the third core and a third power rail that receives a third voltage, the third power gating switch being selectively turned on in response to a third power gating signal; and
a fourth power gating switch which is arranged between the fourth core and a fourth power rail that receives a fourth voltage, the fourth power gating switch being selectively turned on in response to a fourth power gating signal.

12. The SoC of claim 11, further comprising:
a second power switch which is connected between the second power rail and the third power rail, and is selectively turned on in response to a second power control signal to connect the second power gating switch or the third power gating switch to both the second power rail and the third power rail;
a third power switch which is connected between the third power rail and the fourth power rail, and is selectively turned on in response to a third power control signal to connect the third power gating switch or the fourth power gating switch to both the third power rail and the fourth power rail; and
a fourth power switch which is connected between the fourth power rail and the first power rail, and is selectively turned on in response to a fourth power control signal to connect the fourth power gating switch or the first power gating switch to both the fourth power rail and the first power rail.

13. The SoC of claim 12, wherein,
when the first core is in an active state and the second through fourth cores are in an idle state, and
when the operating frequency of the first core is higher than a first reference frequency and less than or equal to a second reference frequency, one of the second power switch and the fourth power switch is turned on, and
when the operating frequency of the first core is higher than the second reference frequency, both the second power switch and the fourth power switch are turned on.

14. The SoC of claim 12, further comprising:
a fifth power switch which is connected between the first power rail and the third power rail, and is selectively turned on in response to a fifth power control signal to connect the first power gating switch or the third power gating switch to both the first power rail and the third power rail; and
a sixth power switch which is connected between the second power rail and the fourth power rail, and is selectively turned on in response to a sixth power control signal to connect the second power gating switch or the fourth power gating switch to both the second power rail and the fourth power rail.

15. The SoC of claim 12, wherein
the first power switch is arranged between the first core and the second core,
the second power switch is arranged between the second core and the third core,
the third power switch is arranged between the third core and the fourth core, and
the fourth power switch is arranged between the fourth core and the first core.

16. The SoC of claim 1, wherein
the first power switch is arranged between the first core and the second core.

17. An electronic device comprising:
a first voltage regulator configured to provide a first voltage to a first power rail;
a second voltage regulator configured to provide a second voltage to a second power rail;
a plurality of cores including a first core and a second core;
a first power gating switch which is arranged between the first power rail and the first core and is selectively turned on in response to a first power gating signal;
a second power gating switch which is arranged between the second power rail and the second core and is selectively turned on in response to a second power gating signal; and
a power switch which is arranged between the first power rail and the second power rail, and is selectively turned on in response to a power control signal to connect the first power gating switch or the second power gating switch to both the first power rail and the second power rail,
wherein the power switch is selectively turned on based on an operating frequency or an operating voltage of an active core among the first core and the second core, so that the active core is connected to both the first power rail and the second power rail through one of the first power gating switch and the second power gating switch, which is connected to the active core, and the power switch.

18. The electronic device of claim 17, wherein
the first voltage regulator and the second voltage regulator, the plurality of cores, the first power gating switch and the second power gating switch, and the power switch are provided on a same chip.

19. The electronic device of claim 17, wherein
the first voltage regulator and the second voltage regulator are provided on a first chip, and
the plurality of cores, the first power gating switch and the second power gating switch, and the power switch are provided on a second chip.

20. An electronic device comprising:
a first intellectual property (IP);
a second IP;
a first voltage regulator connected to the first IP via a first power rail and configured to provide a first voltage to the first IP;

a second voltage regulator connected to the second IP via a second power rail and configured to provide a second voltage to the second IP; and a power switch which is arranged between the first power rail and the second power rail and is driven according to a power control signal, wherein, when the power control signal is enabled, the power switch is turned on to connect the first IP or the second IP to both the first power rail and the second power rail, wherein the power switch is selectively turned on based on an operating frequency or an operating voltage of an active IP among the first IP and the second IP, so that the active IP is connected to both the first power rail and the second power rail through the power switch.

\* \* \* \* \*